United States Patent
Mikado et al.

(10) Patent No.: US 9,044,830 B2
(45) Date of Patent: Jun. 2, 2015

(54) METHOD FOR FORMING CAVITY, APPARATUS FOR FORMING CAVITY, METHOD FOR MANUFACTURING CIRCUIT BOARD, AND CIRCUIT BOARD

(71) Applicant: IBIDEN CO., LTD., Ogaki-shi (JP)

(72) Inventors: Yukinobu Mikado, Ogaki (JP); Yuki Tanaka, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/141,800

(22) Filed: Dec. 27, 2013

(65) Prior Publication Data

US 2014/0182917 A1    Jul. 3, 2014

(30) Foreign Application Priority Data

Dec. 28, 2012    (JP) ................. 2012-288865

(51) Int. Cl.
| | |
|---|---|
| H05K 1/11 | (2006.01) |
| B23K 26/00 | (2014.01) |
| B23K 26/38 | (2014.01) |
| H05K 3/46 | (2006.01) |
| B23K 26/08 | (2014.01) |
| H05K 3/00 | (2006.01) |
| H05K 1/18 | (2006.01) |

(52) U.S. Cl.
CPC ............ *B23K 26/383* (2013.01); *B23K 26/385* (2013.01); *Y10T 29/49135* (2015.01); *H05K 3/4697* (2013.01); *H05K 2203/107* (2013.01); *B23K 26/08* (2013.01); *B23K 26/386* (2013.01); *H05K 1/185* (2013.01); *H05K 3/0032* (2013.01); *H05K 3/4602* (2013.01); *H05K 2201/10636* (2013.01)

(58) Field of Classification Search
CPC .... B23K 26/08; B23K 26/386; B23K 26/383; B23K 26/385; H05K 3/4697; H05K 3/0032; H05K 2201/10636; H05K 3/4602; H05K 1/185; H05K 2203/107; Y10T 29/49135
USPC .................. 174/262, 266; 219/121.7, 121.71, 219/121.78, 121.6, 121.61, 121.62; 29/835
See application file for complete search history.

(56) References Cited

U.S. PATENT DOCUMENTS

| | | | |
|---|---|---|---|
| 6,642,477 B1 * | 11/2003 | Patel et al. ............... | 219/121.71 |
| 7,427,718 B2 * | 9/2008 | Ng et al. ........................ | 174/255 |
| 2007/0031993 A1 * | 2/2007 | Nemets et al. ................ | 438/110 |

(Continued)

FOREIGN PATENT DOCUMENTS

JP    2010-245530 A    10/2010

*Primary Examiner* — Hoa C Nguyen
(74) *Attorney, Agent, or Firm* — Oblon, McClelland, Maier & Neustadt, L.L.P.

(57) ABSTRACT

A method for forming cavity in substrate includes setting start position on closed loop line having circumference L for substrate, consecutively irradiating laser from laser device upon board for the substrate such that holes are formed, and moving the device in loop from the start position along the line such that penetrating hole is formed through the board. The start position of first loop is set as base position, the moving includes shifting the start position by distance d after each loop and controlling such that the moving satisfies $p=\Sigma d_i$, $m \cong L/p$ and $M=m \times n$, where $i=1$ to $n$, n represents number of loops, p represents pitch of the holes, m represents number of the holes in loop, $\Sigma d_i$ is distance from the base position for the start position after i-th loop, and M is number of the holes by the loops.

20 Claims, 17 Drawing Sheets

(56) References Cited

U.S. PATENT DOCUMENTS

| | | | |
|---|---|---|---|
| 2008/0093349 A1* | 4/2008 | Bruland et al. | 219/121.69 |
| 2011/0203924 A1* | 8/2011 | Wohlstadter et al. | 204/403.01 |
| 2011/0315334 A1* | 12/2011 | Katoh et al. | 163/5 |
| 2013/0154159 A1* | 6/2013 | Noel et al. | 264/400 |
| 2013/0182401 A1* | 7/2013 | Furutani et al. | 361/782 |

* cited by examiner

FIG.1
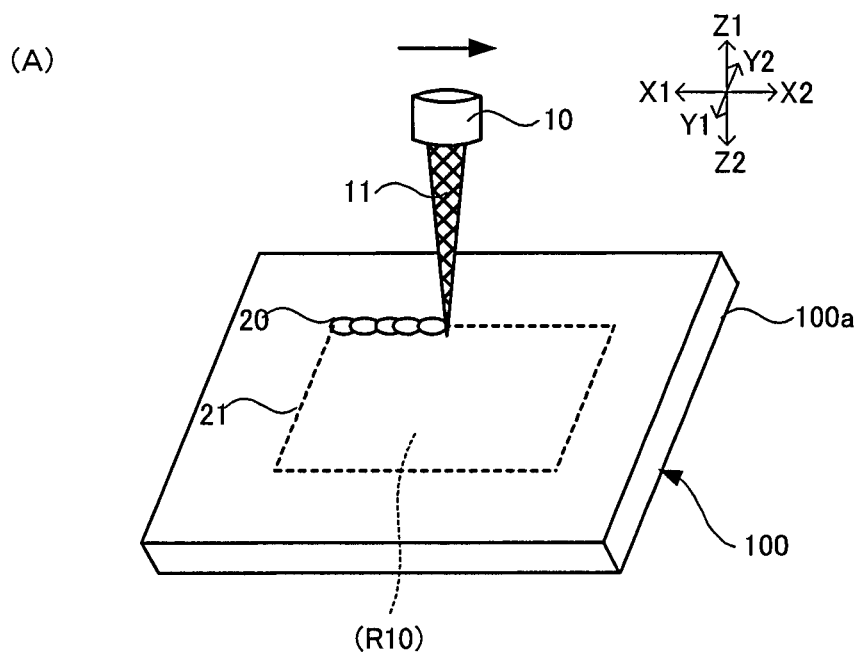
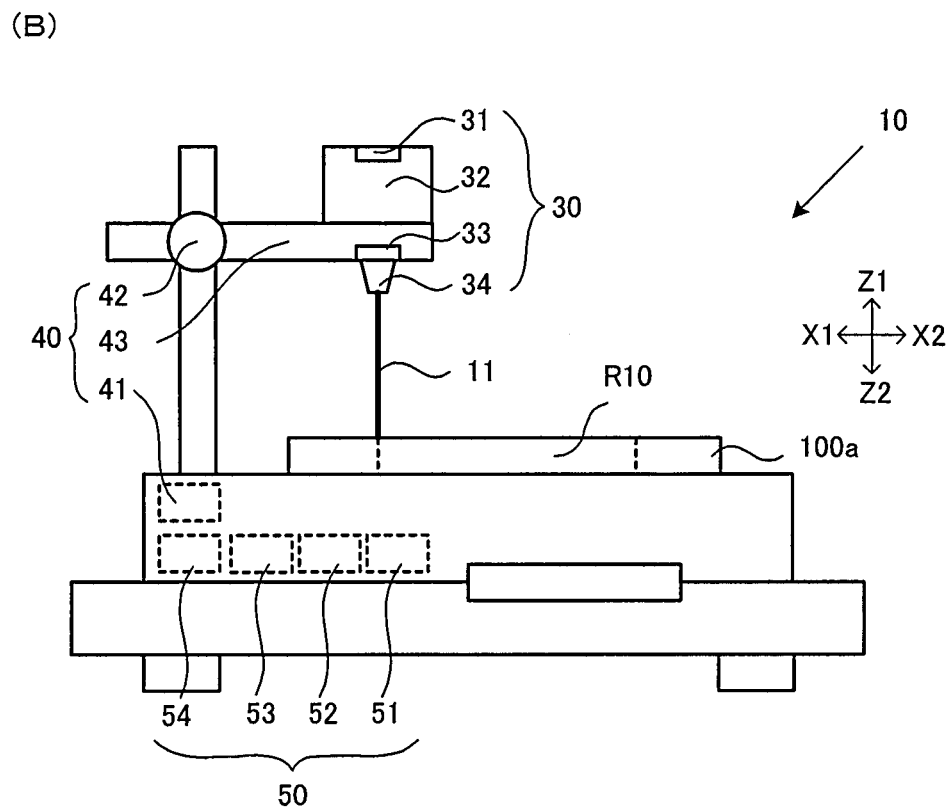

FIG.7
(A)
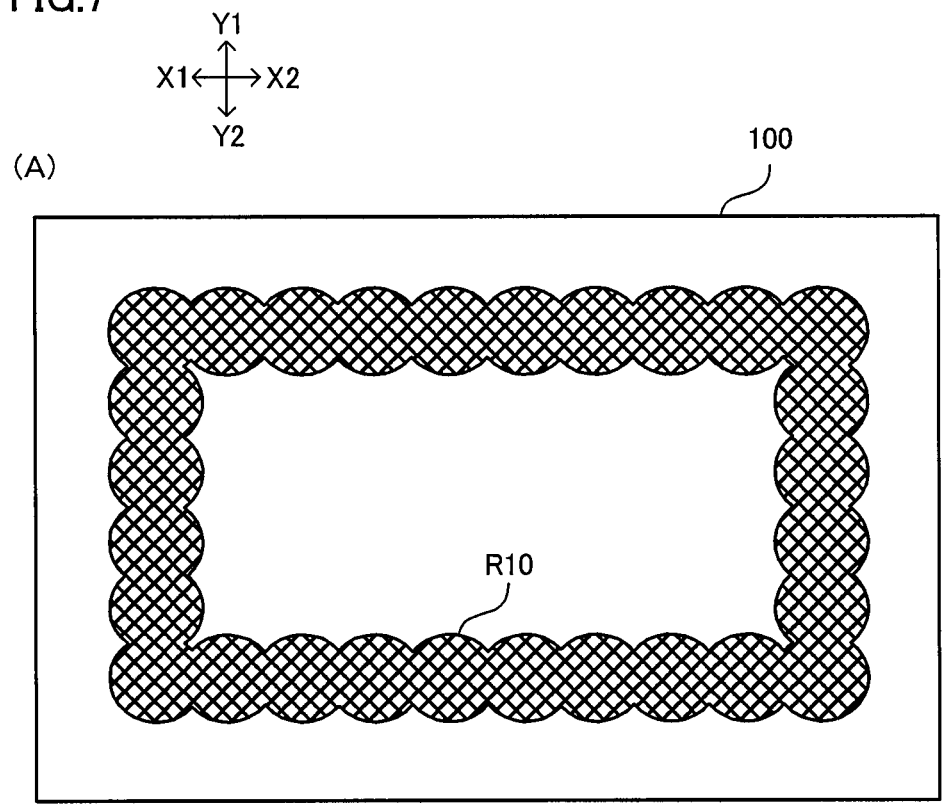
(B)
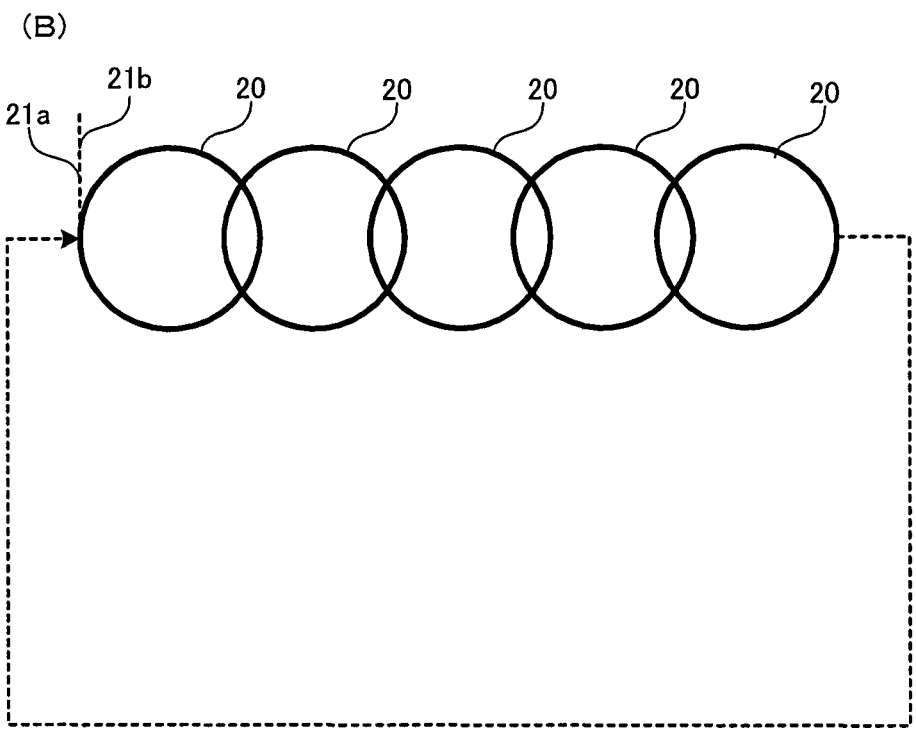

FIG.8
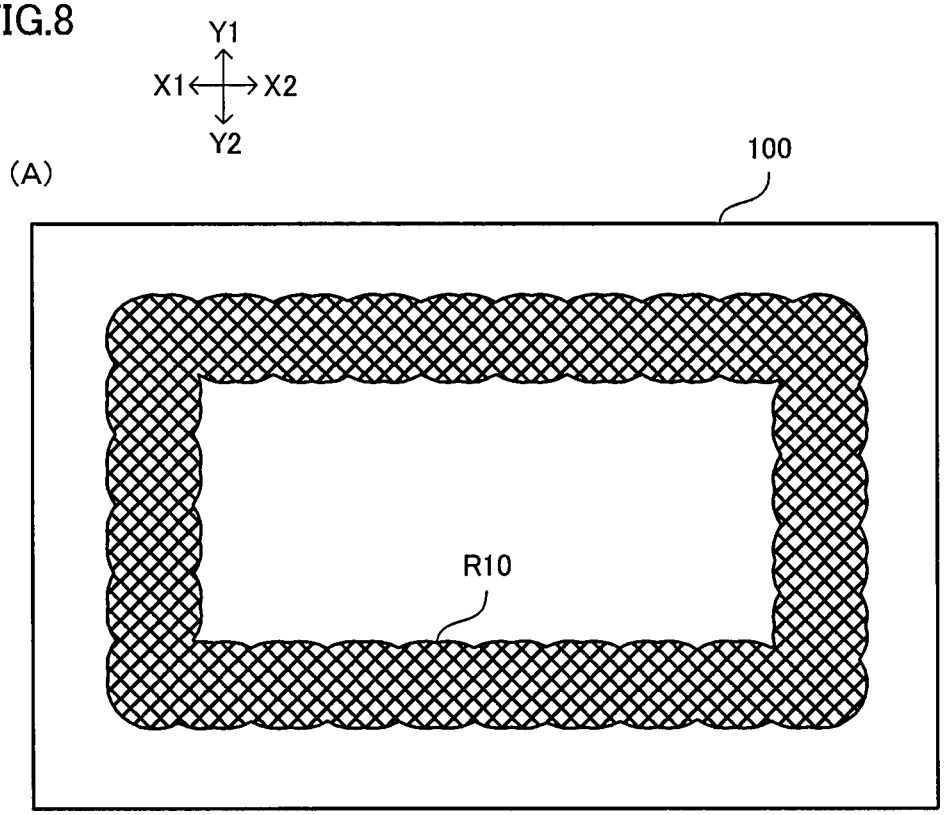
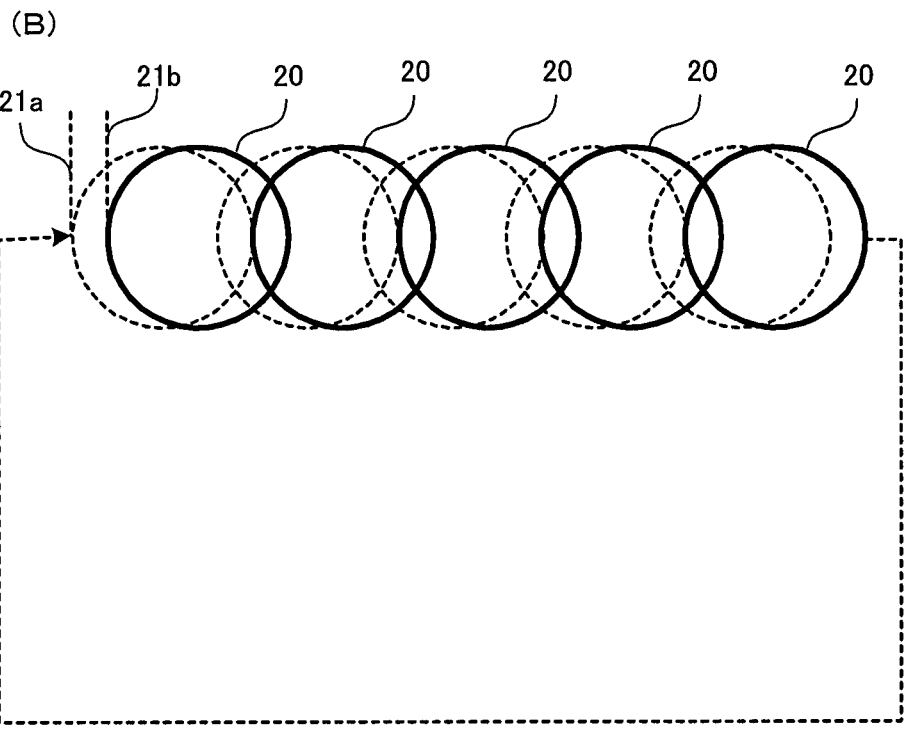

FIG.9
(A)
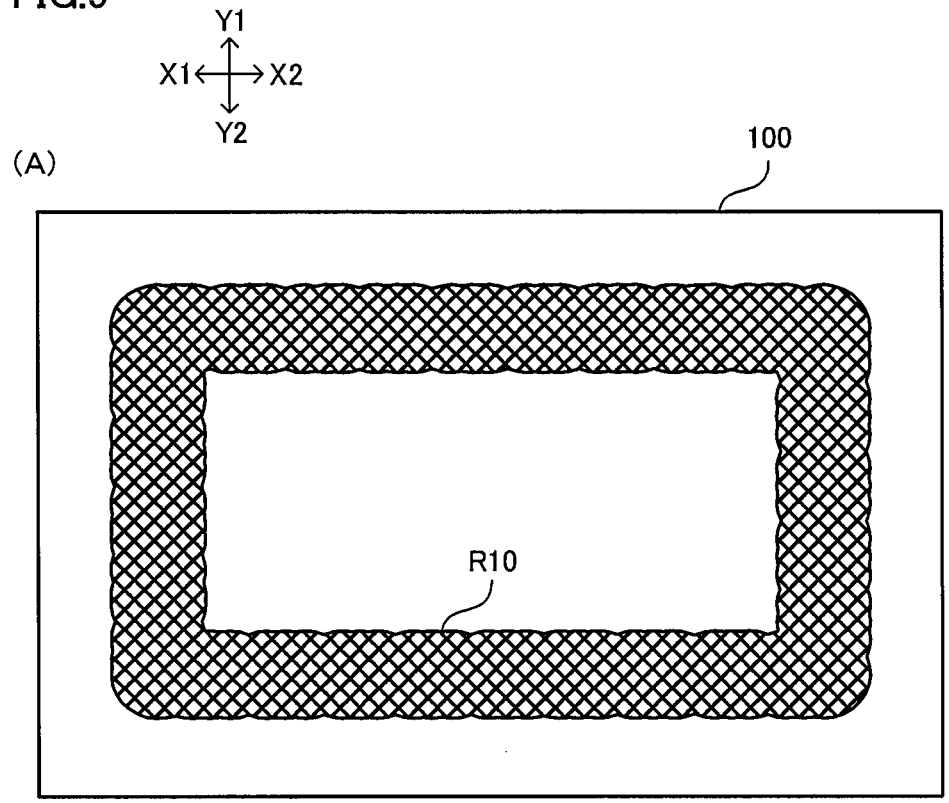
(B)
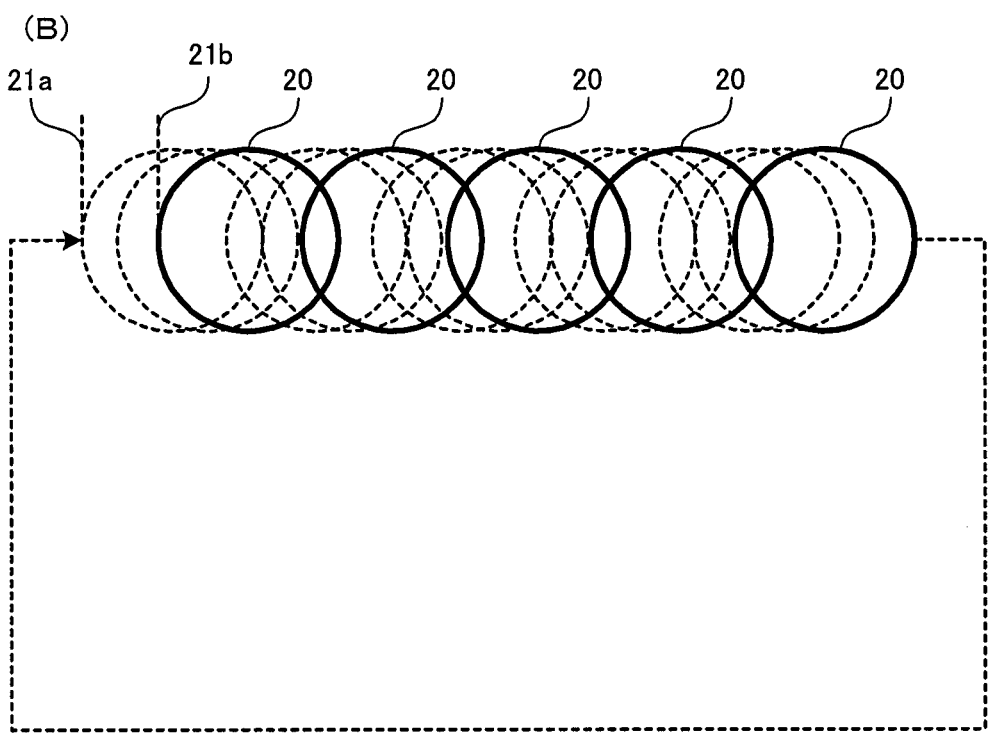

FIG.11
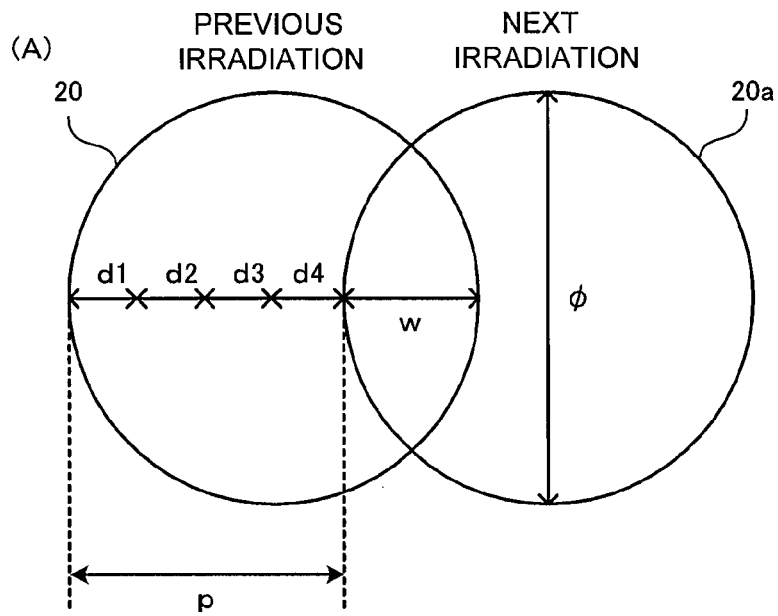
DIAMETER $\phi = 80 \mu m$
NUMBER OF LOOPS n = 4 TIMES
SHIFT QUANTITY d1=d2=d3=d4=15 $\mu m$
PROCESSING PITCH p=60 $\mu m$
HOLE OVERLAPPING WIDTH w=20 $\mu m$
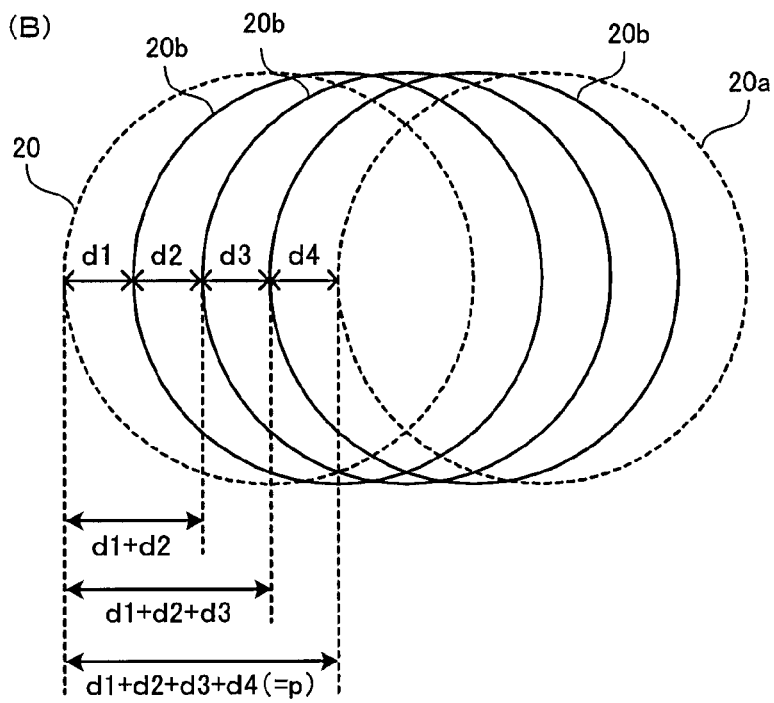

FIG.13

| FREQUENCY: 2400Hz | | | |
|---|---|---|---|
| NO. OF LOOPS | FORMED HOLES PER LOOP | TIME TO FORM ADJACENT HOLE (sec) | PROCESSING PITCH PER LOOP |
| 1 | 212 | 0.0004 | |
| 2 | 106 | 0.0442 | 30 |
| 3 | 70.7 ≒ 71 or 70 | 0.0296 | 45 |
| 4 | 53 | 0.0221 | 60 |
| 5 | 42.4 ≒ 43 or 42 | 0.0179 | 75 |
| 6 | 35.3 ≒ 36 or 35 | 0.0150 | 90 |
| 7 | 30.2 ≒ 31 or 30 | 0.0126 | 105 |
| 8 | 26.5 ≒ 27 or 26 | 0.0113 | 120 |
| 9 | 23.6 ≒ 24 or 23 | 0.0100 | 135 |
| 10 | 21.2 ≒ 22 or 21 | 0.0092 | 150 |

FIG.15
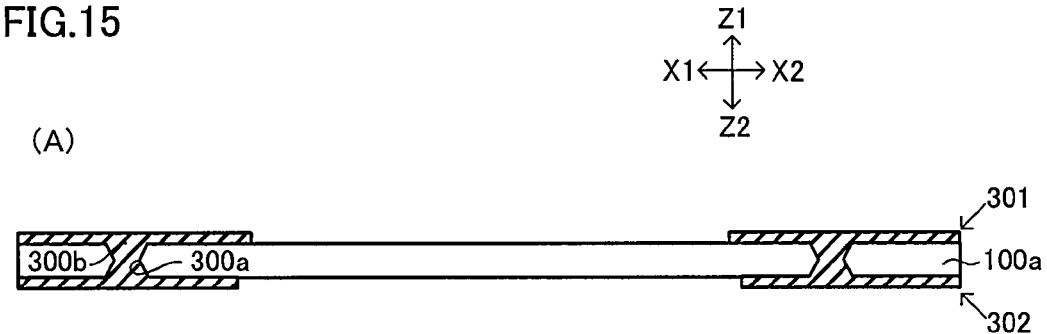
(A)
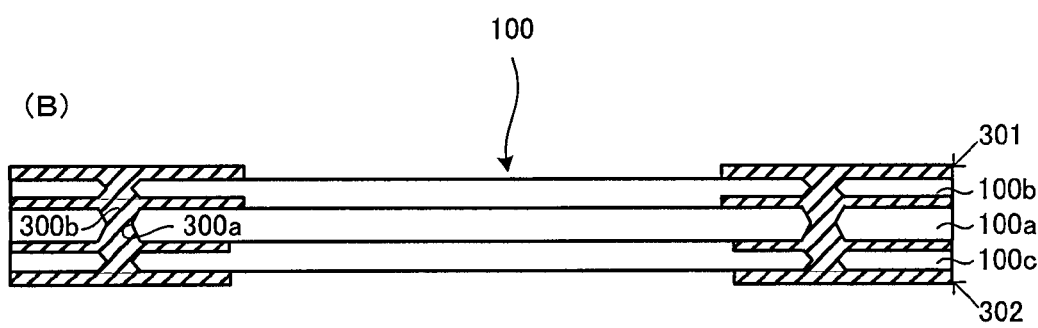
(B)
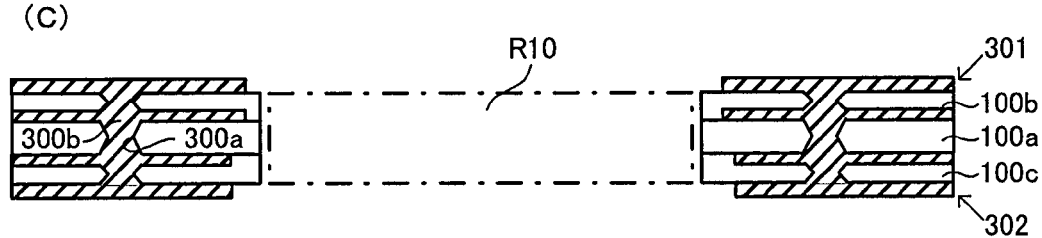
(C)
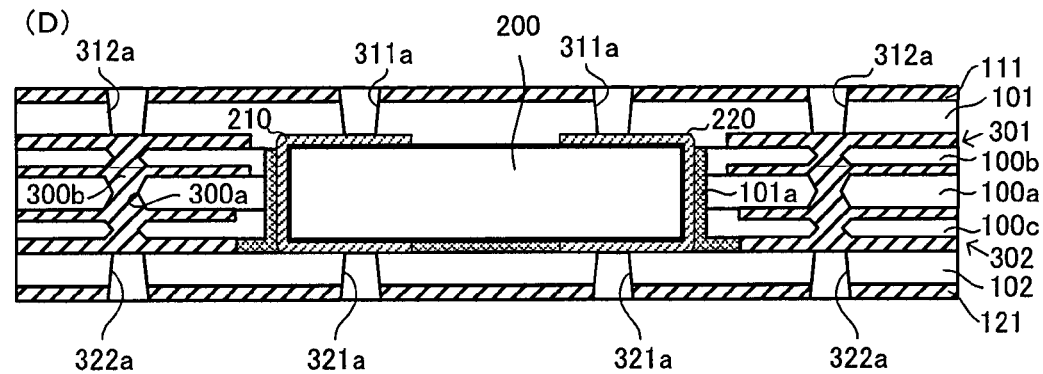
(D)

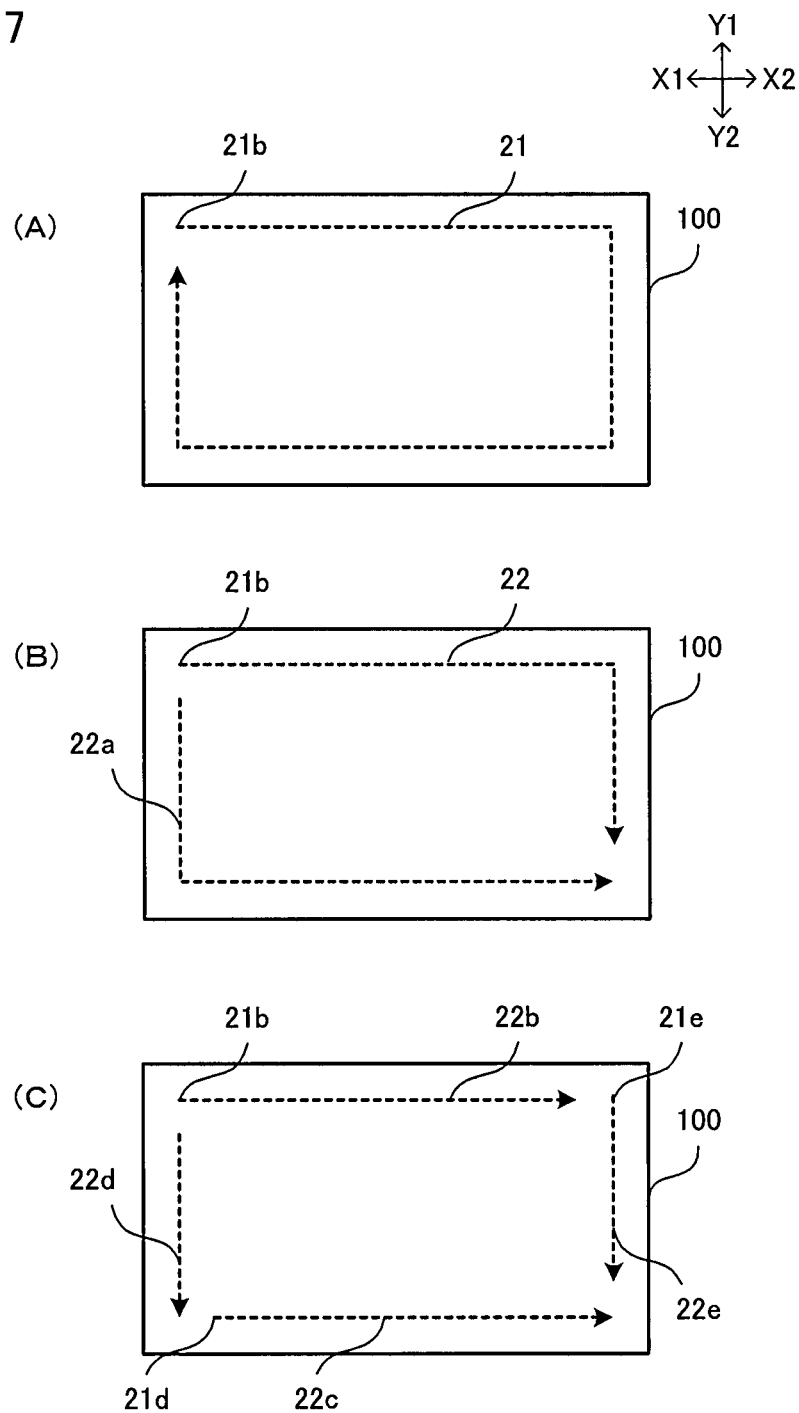

METHOD FOR FORMING CAVITY, APPARATUS FOR FORMING CAVITY, METHOD FOR MANUFACTURING CIRCUIT BOARD, AND CIRCUIT BOARD

CROSS-REFERENCE TO RELATED APPLICATIONS

The present application is based upon and claims the benefit of priority to Japanese Patent Application No. 2012-288865, filed Dec. 28, 2012, the entire contents of which are incorporated herein by reference.

BACKGROUND OF THE INVENTION

1. Field of the Invention

The present invention relates to a method for forming a cavity, a manufacturing method of a circuit board using the cavity-forming method, and a circuit board manufactured using the manufacturing method.

2. Description of Background Art

Patent Publication 2010-245530 describes a circuit board having a cavity into which an electronic component is built. The cavity of the circuit board is formed using a method for forming a penetrating hole by irradiating a laser beam onto a substrate of the circuit board. The penetrating hole is formed by irradiating a laser along a closed loop line set on the substrate to form multiple holes and boring the interior of the closed loop line with the holes. The entire contents of this publication are incorporated herein by reference.

SUMMARY OF THE INVENTION

According to one aspect of the present invention, a method for forming a cavity in a core substrate includes setting a start position on a closed loop line having a circumference L in µm for a core substrate, consecutively irradiating laser from a laser irradiating device upon a flat board for the core substrate such that laser-processed holes each having a diameter $\phi$ in µm are formed in the flat board, and moving the laser irradiating device in a loop from the start position of the closed loop line along the closed loop line such that a penetrating hole penetrating through the flat board is formed in the flat board for the core substrate. The start position of a first loop by the laser irradiating device is set as a base position on the closed loop line, the moving of the laser irradiating device includes shifting the start position by a distance d after each loop and controlling the laser irradiating device such that the moving of the laser irradiating device in the loop satisfies $p=\Sigma d_i$, $m \approx L/p$ and $M=m \times n$, where i=1 to n, n represents a number of loops by the laser irradiating device and is a natural number of 2 or greater, p represents a processing pitch of the laser-processed holes, m represents a number of the laser-processed holes in each loop and is a natural number, $\Sigma d_i$ is a total distance shifted from the base position for the start position of the laser irradiating device after an i-th loop, and M is a number of the laser-processed holes formed by the number of loops along the closed loop line and is a natural number.

According to another aspect of the present invention, an apparatus for forming a cavity in a core substrate includes a laser irradiating device which consecutively irradiates laser upon a flat board such that laser-processed holes each having a diameter $\phi$ in µm are formed in the flat board, a moving device which moves the laser irradiating device in a loop along a closed loop line from a start position of the closed loop line such that a penetrating hole penetrating through the flat board is formed in the flat board for the core substrate, and a control device which sets the start position of the closed loop line having a circumference L in µm for the core substrate, sets the start position of a first loop by the laser irradiating device as a base position on the closed loop line, shifts the start position by a distance d after each loop and controls the laser irradiating device such that movement of the laser irradiating device in the loop satisfies $p=\Sigma d_i$, $m \approx L/p$ and $M=m \times n$, where i=1 to n, n represents a number of loops by the laser irradiating device and is a natural number of 2 or greater, p represents a processing pitch of the laser-processed holes, m represents a number of the laser-processed holes in each loop and is a natural number, $\Sigma d_i$ is a total distance shifted from the base position for the start position of the laser irradiating device after an i-th loop, and M is a number of the laser-processed holes formed by the number of loops along the closed loop line and is a natural number.

According to yet another aspect of the present invention, a method for manufacturing a printed circuit board includes preparing a core substrate including multiple insulation layers, setting a start position on a closed loop line having a circumference L in µm for the core substrate, consecutively irradiating laser from a laser irradiating device upon the core substrate such that laser-processed holes each having a diameter $\phi$ in µm are formed in the core substrate, and moving the laser irradiating device in a loop from the start position of the closed loop line along the closed loop line such that a penetrating hole formed to accommodate an electronic component and penetrating through the core substrate is formed in the core substrate. The start position of a first loop by the laser irradiating device is set as a base position on the closed loop line, the moving of the laser irradiating device includes shifting the start position by a distance d after each loop and controlling the laser irradiating device such that the moving of the laser irradiating device in the loop satisfies $p=\Sigma d_i$, $m \approx L/p$ and $M=m \times n$, where i=1 to n, n represents a number of loops by the laser irradiating device and is a natural number of 2 or greater, p represents a processing pitch of the laser-processed holes, m represents a number of the laser-processed holes in each loop and is a natural number, $\Sigma d_i$ is a total distance shifted from the base position for the start position of the laser irradiating device after an i-th loop, and M is a number of the laser-processed holes formed by the number of loops along the closed loop line and is a natural number.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a perspective view illustrating a state in which a penetrating hole is formed by irradiating a laser in a cavity-forming method according to an embodiment of the present invention; and FIG. 1B is a front view illustrating a laser processing apparatus in the state shown in FIG. 1A;

FIG. 7A is a plan view illustrating a state of processing of the core substrate with laser-processed holes when a laser irradiator has looped once; FIG. 7B is a diagram illustrating a string of consecutive laser-processed holes;

FIG. 8A is a plan view illustrating a state of processing of the core substrate with laser-processed holes when the laser irradiator has looped twice; FIG. 8B is a diagram illustrating a string of consecutive laser-processed holes;

FIG. 9A is a plan view illustrating a state of processing of the core substrate with laser-processed holes when the laser irradiator has looped three times; FIG. 9B is a diagram illustrating a string of consecutive laser-processed holes;

FIG. 11A is a diagram illustrating a processing pitch which is set for laser irradiation; FIG. 11B is a diagram illustrating a state in which a start position of the laser irradiator is offset in each loop of the laser irradiator;

FIG. 13 is a diagram illustrating a relationship between the number of irradiation loops of the laser irradiator and the duration and pitch of its processing;

FIGS. 15A to 15D are cross-sectional views illustrating process steps in a manufacturing method of a circuit board according to a modified example of the present invention;

FIGS. 17A to 17C are plan views illustrating examples of closed loop lines set on a core substrate in the cavity-forming method according to modified examples of the present invention.

DETAILED DESCRIPTION OF THE EMBODIMENTS

Figure 2:
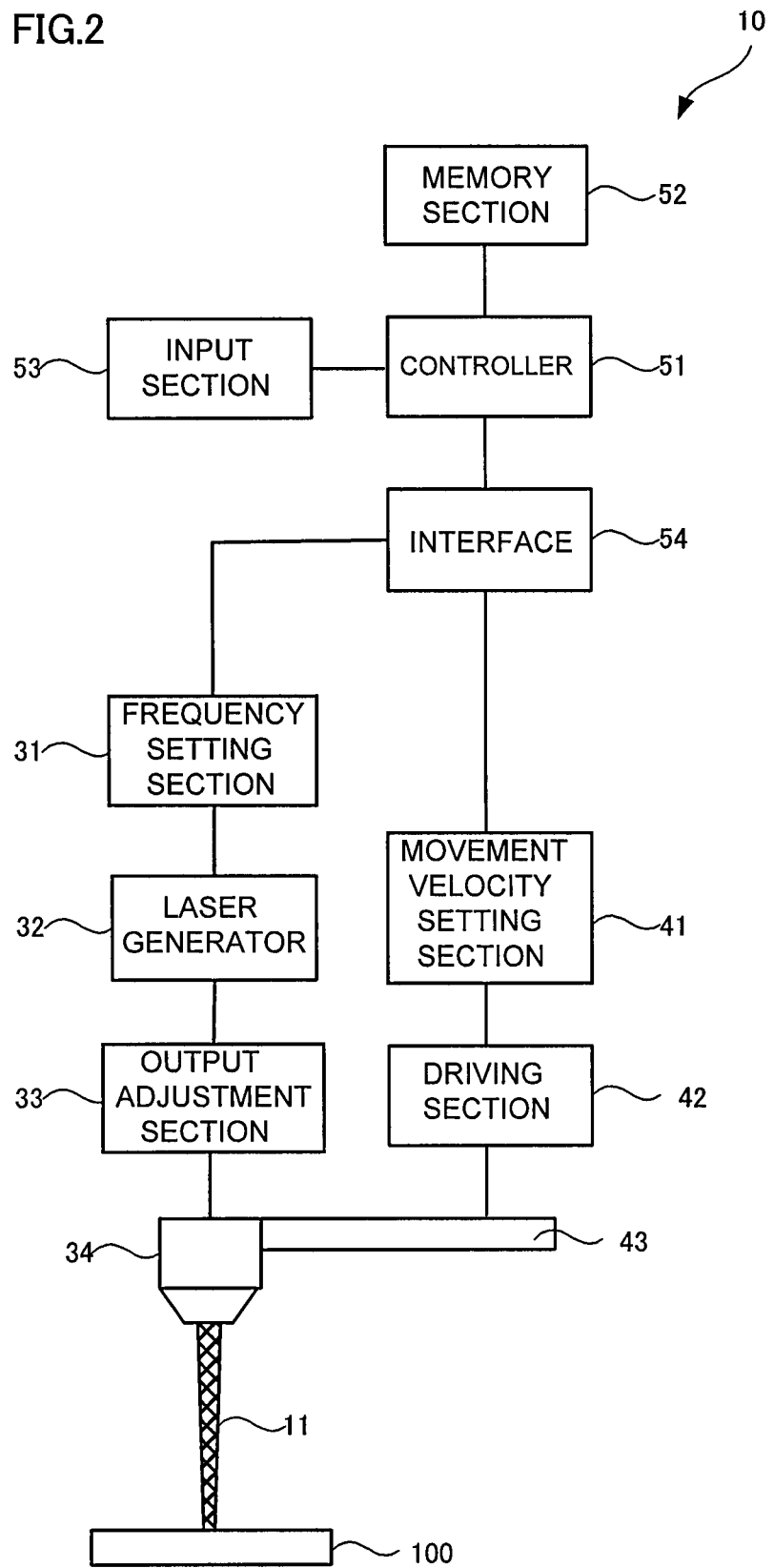
FIG. 2 is a block diagram illustrating the structure of a laser processing apparatus.

The embodiments will now be described with reference to the accompanying drawings, wherein like reference numerals designate corresponding or identical elements throughout the various drawings.

In the following description, each of two main surfaces facing opposite directions along a normal line is referred to as a first surface or a third surface, and a second surface or a fourth surface. In a lamination direction, the side closer to a core substrate is referred to as a lower layer (or an inner-layer side) and the side farther from the core substrate is referred to as an upper layer (or an outer-layer side).

A conductive layer is a layer having one or multiple conductor patterns. Conductive layers may include a conductive pattern forming an electric circuit such as an interconnection (including the ground), pad and land, or a planar conductive pattern not forming an electric circuit.

Apertures include holes, trenches, notches and slits. Holes include holes that penetrate through a substrate and holes that do not. Via holes and through holes are included in the holes. In the following description, a conductor formed in a via hole (i.e., on its wall surface or bottom surface) is referred to as a via conductor. A conductor formed in a through hole (i.e., on its wall surface) is referred to as a through-hole conductor.

"To prepare" includes not only purchasing materials and parts to manufacture an apparatus but also purchasing and using finished products.

An electronic component being placed in an aperture includes not only the electronic component being completely accommodated in the aperture but also only a portion of the electronic part positioned in the aperture.

The "width" of a hole or a cylinder (a protrusion), unless otherwise indicated, means a diameter if it is a circle and $2\sqrt{(\text{cross-sectional area}/\pi)}$ if it is other than a circle.

Whether or not an uneven measurement—for instance, the thickness of an irregular portion or the width of a tapered portion—is within a predetermined range is determined based on whether or not the mean value of such a measurement (the mean value of effective values excluding abnormal values) is included in the range. However, such a definition does not apply to a case that uses a value other than the mean value, such as the maximum value.

"To loop" means that a laser irradiator passes all paths of a closed loop line set on a core substrate. Looping includes a case in which, like a unicursal drawing, the laser irradiator starts at a start position of a closed loop line, moves along the closed loop line, and returns to the start position.

A manufacturing method of a circuit board and an apparatus used in a cavity-forming method according to an embodiment of the present invention will be described with reference to FIGS. 1 and 2. The manufacturing method of a circuit board according to an embodiment of the present invention includes the above-mentioned cavity-forming method as a part of its process. In the embodiment, a laser processing apparatus 10 is used to form a cavity.

The cavity-forming method according to an embodiment includes forming penetrating hole (R10) by irradiating a laser 11 onto a flat board (100a), which is used as a core substrate 100. Specifically, as shown in FIG. 1A, a closed loop line 21 is set on a core substrate 100 and the irradiation position of the laser 11 is moved along the closed loop line 21 while laser 11 is irradiated in pulses from the laser processing apparatus 10. A penetrating hole (R10) is formed by hollowing out the interior portion of the closed loop line 21 with multiple consecutively arranged laser-processed holes 20 formed by the laser 11. Although the closed loop line 21 is a rectangle in the present embodiment, any other shape, such as a circle or a polygon, may be employed as long as it makes a closed line whose start point and end point are connected.

The laser processing apparatus 10, used to form the penetrating hole (R10), has an irradiation unit 30, a movement unit 40, and a control unit 50 as shown in FIGS. 1B and 2. The irradiation unit 30 has a frequency setting section 31, a laser generator 32, an output adjustment section 33, and a laser irradiator 34. The movement unit 40 includes a movement velocity setting section 41, a driving section 42, and an arm 43. The control unit 50 includes a controller 51, a memory section 52, an input section 53, and an interface 54.

The frequency setting section 31 sets the frequency of generated laser 11 per unit time (one second) by the laser generator 32 based on a frequency (f) (Hz) that is input by an operator through an operation lever or operation buttons. If the frequency (f) is set at 1,200 Hz, for example, a laser 11 is irradiated 1,200 times per second from the laser generator 32. When the frequency (f) (Hz) is increased, the time interval between irradiations ($\Delta t = 1/f$) of the laser 11 becomes shorter. Considering the forming efficiency of a penetrating hole (R10), it is preferred that the frequency be 1,200 Hz or greater and 10,000 Hz or less, more preferably 2,400 Hz or greater and 3,600 Hz or less.

The laser generator 32 amplifies light to generate a laser 11 with a period of (Δt) (μs) based on the frequency (f) (Hz) set by the frequency setting section 31. The laser 11 includes, for example, a $CO_2$ laser, which is generated using carbon dioxide gas as an amplification medium.

The output adjustment section 33 sets output energy E (W) of the laser 11 irradiated from the laser irradiator 34 based on a value of the output energy E (W) input by an operator through an operation lever and operation buttons. When the output energy E (W) is set greater, the diameter (φ) (μm) of a laser-processed hole 20 formed on the core substrate 100 becomes larger. Considering forming efficiency and energy efficiency in forming the penetrating hole (R10), the output energy E of the laser 11 is preferred to be 1 W or greater and 50 W or less.

The laser irradiator 34 irradiates a laser 11 generated by the laser generator 32 with the output energy E (W) set by the output adjustment section 33. In the present embodiment, the core substrate 100 is irradiated with the laser 11 from above. The laser 11 is not irradiated after the completion of irradiation at a previous irradiation position until it moves to the next irradiation position.

The movement velocity setting section 41 sets the velocity of movement of the laser irradiator 34 moved by the driving section 42 based on movement velocity (v) (μm/μs) input by the operator through the operation lever and operation buttons. Using this movement velocity (v) (μm/μs), processing pitch (p) (μm), an interval distance that the laser irradiator 34 moves is computed by the controller 51. Processing pitch (p) (μm) of laser-processed holes 20 is expressed by movement distance per time interval (p=v×Δt) since the laser 11 is irradiated with a period associated with the frequency (f) (Hz) (Δt=1/f).

The driving section 42 includes, for example, a motor, and generates power to move the arm 43 with velocity set by the movement velocity setting section 41. The arm 43 holds the laser irradiator 34 above the core substrate 100 and moves the laser irradiator 34 horizontally by the power generated by the driving section 42. The core substrate 100 is fixed and the driving section 42 moves the laser irradiator 34 horizontally in parallel with the (X-Y) plane in the present embodiment. However, that is not the only option. For example, the laser irradiator 34 may be fixed and the driving section 42 may move the core substrate 100 horizontally in parallel with the (X-Y) plane.

The input section 53 receives setting data input by an operator through GUI (Graphical User Interface) including a mouse and touch panel and transmits the setting data to the controller 51. The setting data input by an operator includes the shape of a closed loop line 21, the circumference (L) (μm) of the closed loop line 21, a base position of the closed loop line 21, a loop count (n) (a natural number of 2 or greater) with which the laser irradiator 34 moves in a loop along the closed loop line 21, and shift quantity $(d_i)(i=1$ to $n-1)$ by which the laser irradiator 34 displaces the start position in every loop.

The memory section 52 includes, for example, ROM (Read Only Memory) for storing computer programs or data and RAM (Random Access Memory) used as a working region to temporarily store setting data and computed data.

The controller 51 contains, for example, a microprocessor (CPU), executes various computations based on a program readout from the memory section 52 and controls each section of the laser processing apparatus 10. The controller 51 stores various setting data transmitted from the input section 53 into the memory section 52. The controller 51 executes various computations using the various setting data readout from the memory section 52 and controls the irradiation unit 30 and movement unit 40 via the interface 54.

The interface 54 includes, for example, cables, a communication channel, and sections for various transformations and transmissions and, by intermediating between the controller 51 and the irradiation unit 30 or the movement unit 40, takes part in the data communication between them.

Figure 3:
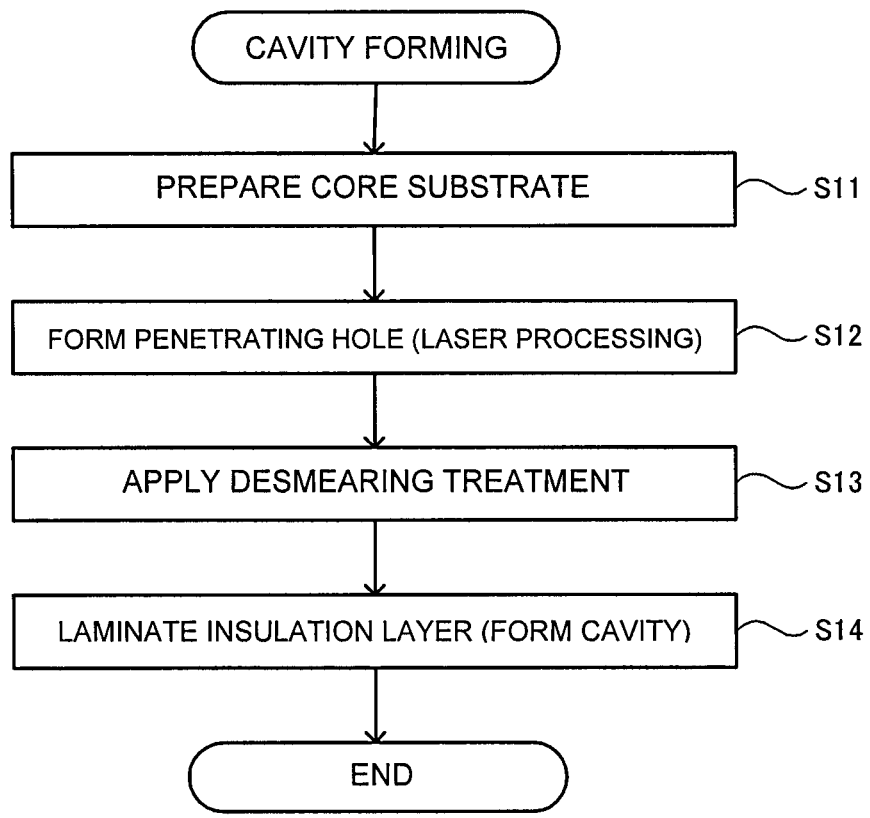
FIG. 3 is a flowchart illustrating a manufacturing method of a circuit board.
Figure 4:
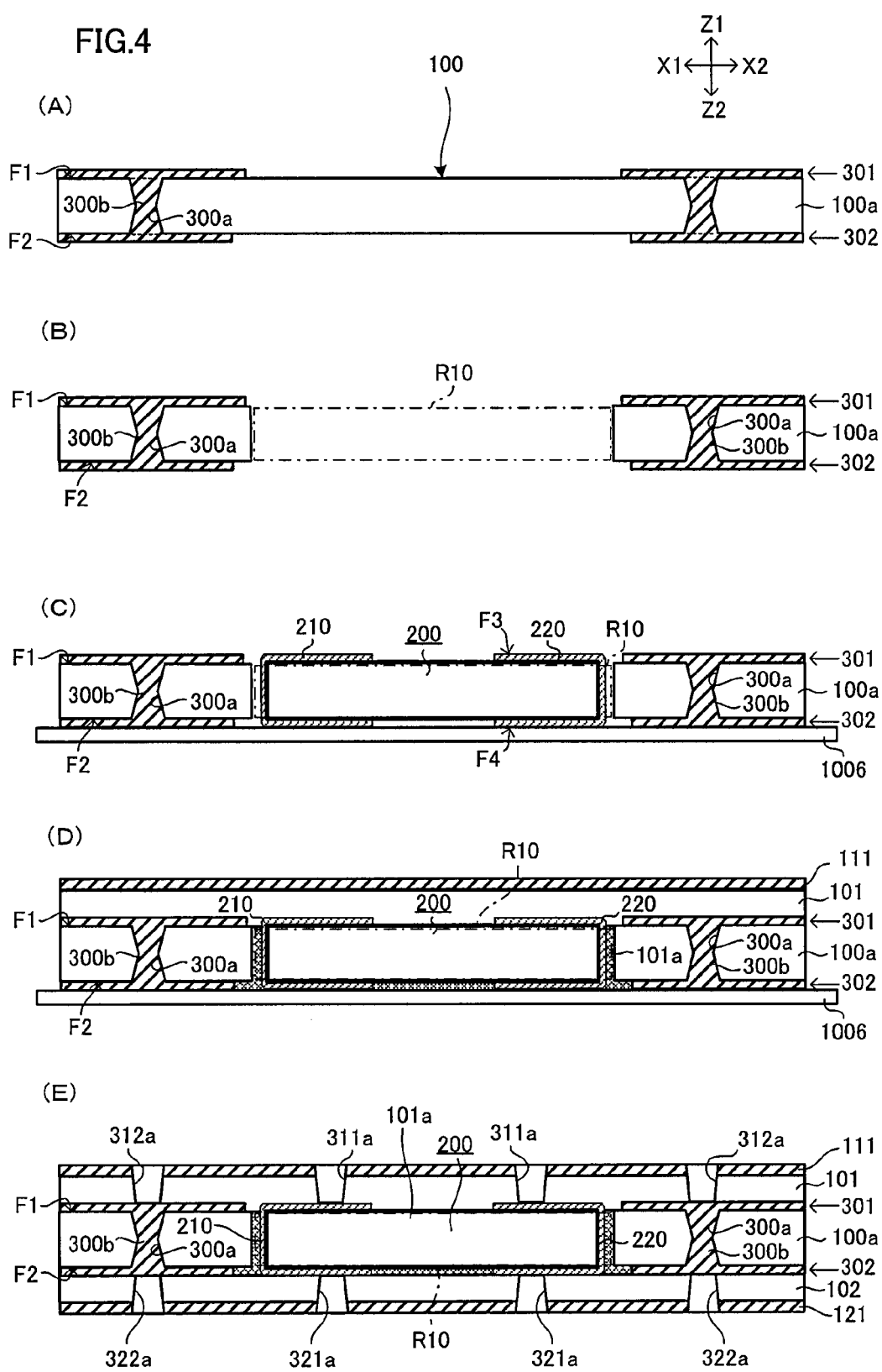
FIGS. 4A to 4E are cross-sectional views illustrating individual process steps of the manufacturing method of the circuit board.

With reference to FIGS. 3 and 4, a manufacturing method of a circuit board will be described below. A circuit board is manufactured by conducting processing from step (S11) to step (S14) in FIG. 3.

First, in step (S11), a core substrate 100 is prepared as shown in FIG. 4A. The core substrate 100 is a flat board that has copper foil formed on its first surface (F1) and second surface (F2). A through hole (300a) penetrating through the core substrate 100 is formed by irradiating the core substrate 100 with a laser. A through-hole conductor (300b) is formed by filling the through hole (300a) with plating. Conductive layers 301 and 302 are formed by applying patterning to each conductive layer formed on the first surface (F1) and the second surface (F2) of the core substrate 100. The applicants have confirmed that when the thermal conductivity of the core substrate 100 is set at 0.60 W/(m·K) or greater but 1 W/(m·K) or less, a penetrating hole (R10) is effectively formed by laser irradiation.

Next, in step (S12), the core substrate 100 is irradiated with a laser, which traces a figure (a closed loop line) inside which a penetrating hole (R10) is formed as shown in FIG. 4B. The penetrating hole (R10) is formed by removing an interior portion of the figure at which the laser is radiated from the core substrate 100. The penetrating hole (R10) is used as a part of a cavity for accommodating electronic component 200 as it will be described later.

Next, in step (S13), desmearing treatment is applied, whereby residual resin is removed from the wall surface of the penetrating hole (R10) by using a solution. With this processing, it is easier to accommodate the electronic component 200 in the cavity. The desmearing treatment may be a wet process as described above or a dry process in which the surface shape of the penetrating hole (R10) after laser processing is made smooth with plasma.

Next, in step (S14), a cavity is formed by laminating an interlayer insulation layer on the core substrate 100 in which the penetrating hole (R10) is formed.

As shown in FIG. 4C, first, an electronic component 200 is placed inside the penetrating hole (R10) in the core substrate 100. Specifically, a carrier 1006, which is made from, for example, PET (polyethylene terephthalate), is disposed on one side (the second surface (F2), for example) of the core substrate 100. With this processing, the opening on one side of the penetrating hole (R10) is covered with the carrier 1006. The electronic component 200 is put into the penetrating hole (R10) from the opening opposite the covered opening of the penetrating hole (R10).

Next, as shown in FIG. 4D, an insulation layer 101 (a first interlayer insulation layer) in a semi-cured state is deposited on the first surface (F1) of the core substrate 100 and the third surface of the electronic component 200, which are opposite the covered opening of the penetrating hole (R10). Copper foil 111 (first copper foil) is further laminated on the insulation layer 101. By pressing the insulation layer 101 in a semi-cured state, resin flows out from the insulation layer 101 and flows into the penetrating hole (R10). With this processing, a gap between the core substrate 100 and the electronic component 200 in the penetrating hole (R10) is filled with insulator (101a) (resin of the insulation layer 101). After the insulator (101a) has filled the penetrating hole (R10), the filling resin (insulator (101a)) and the electronic component 200 are preliminarily adhered. Then, the carrier 1006 is removed. Next, a buildup is applied to the second surface (F2) of the core substrate 100. Specifically, an insulation layer 102 (a second interlayer insulation layer) and copper foil 121 (second copper foil) are laminated on the second surface (F2) of the core substrate 100. The insulation layer 102 is pressed against the core substrate 100 and the electronic component 200 in a semi-cured state by a press or the like and then the insulation layers (101, 102) are cured by heat respectively.

Next, as shown in FIG. 4E, a via conductor and a conductive layer are formed. Specifically, using a laser or the like, holes (311a, 312a) (each is a via hole) are formed on the insulation layer 101 and the copper foil 111, and holes (321a, 322a) (each is a via hole) are formed on the insulation layer 102 and the copper foil 121. The holes (311a, 312a) each penetrate through the insulation layer 101 and the copper foil 111, and the holes (321a, 322a) each penetrate through the insulation layer 102 and the copper foil 121. The holes (311a, 321a) respectively reach an electrode 210 or electrode 220 of the electronic component 200, and the holes (312a, 322a) each reach right above the through-hole conductor (300b). The insulation layer 101 is thus formed on the first surface (F1) of the core substrate 100 and the insulation layer 102 is formed on the second surface (F2) of the core substrate 100. After that, a circuit board of the present embodiment is completed through conventionally well-known process steps.

Any change may be made to the structure of a circuit board and the type, performance, dimensions, material, shape, number of layers, or arrangement of its component unless such change deviates from the scope of the present invention. A manufacturing process of a circuit board is not limited to the process having the order or processing shown in FIGS. 3 and 4. Any change may be made to the order or processing within a range that does not deviate from the scope of the invention. Some step may be omitted depending on purposes.

The method for forming a penetrating hole in step (S12) in FIGS. 3 and 4B is described in detail below with reference to FIGS. 5 to 12.

In the present embodiment, a penetrating hole (R10) having a smooth surface is formed if the equations (1), (2a), (2b), (3) and (4) shown below are satisfied. In the following equations, "L" stands for circumference (μm) of the closed loop line 21, "φ" stands for diameter (μm) of the laser-processed hole 20, "n" stands for the number of loops (a natural number of 2 or greater) in which the laser irradiator 34 moves along the closed loop line 21, "p" stands for processing pitch (μm) which is an interval distance at which the laser irradiator 34 repeats irradiating the laser 11, "m" stands for the number of laser-processed holes 20 (a natural number) formed when the laser irradiator 34 loops once, "M" stands for the total number of laser-processed holes 20 (a natural number) formed when the laser irradiator 34 loops "n" times, "di" stands for shifting quantity (μm) by which the start position (21b) of laser irradiation is displaced when the laser irradiator 34 loops "i" times (i=1, 2, . . . , n−1), and "Σd$_i$" stands for offset or shift quantity (μm) from the base position (21a) which is set as the start position (21b) of laser irradiation when the laser irradiator 34 loops "i" times (i=1, 2, . . . , n−1).

$$p = \Sigma d_i = d_1 + d_2 + \ldots + d_n (i=1 \text{ to } n) \quad (1)$$

$$m \approx L/p \quad (2a)$$

$$M = m \times n \quad (2b)$$

$$\phi/3 \leq p < \phi \quad (3)$$

$$d_1 = d_2 = \ldots = d_n \quad (4)$$

Figure 5:
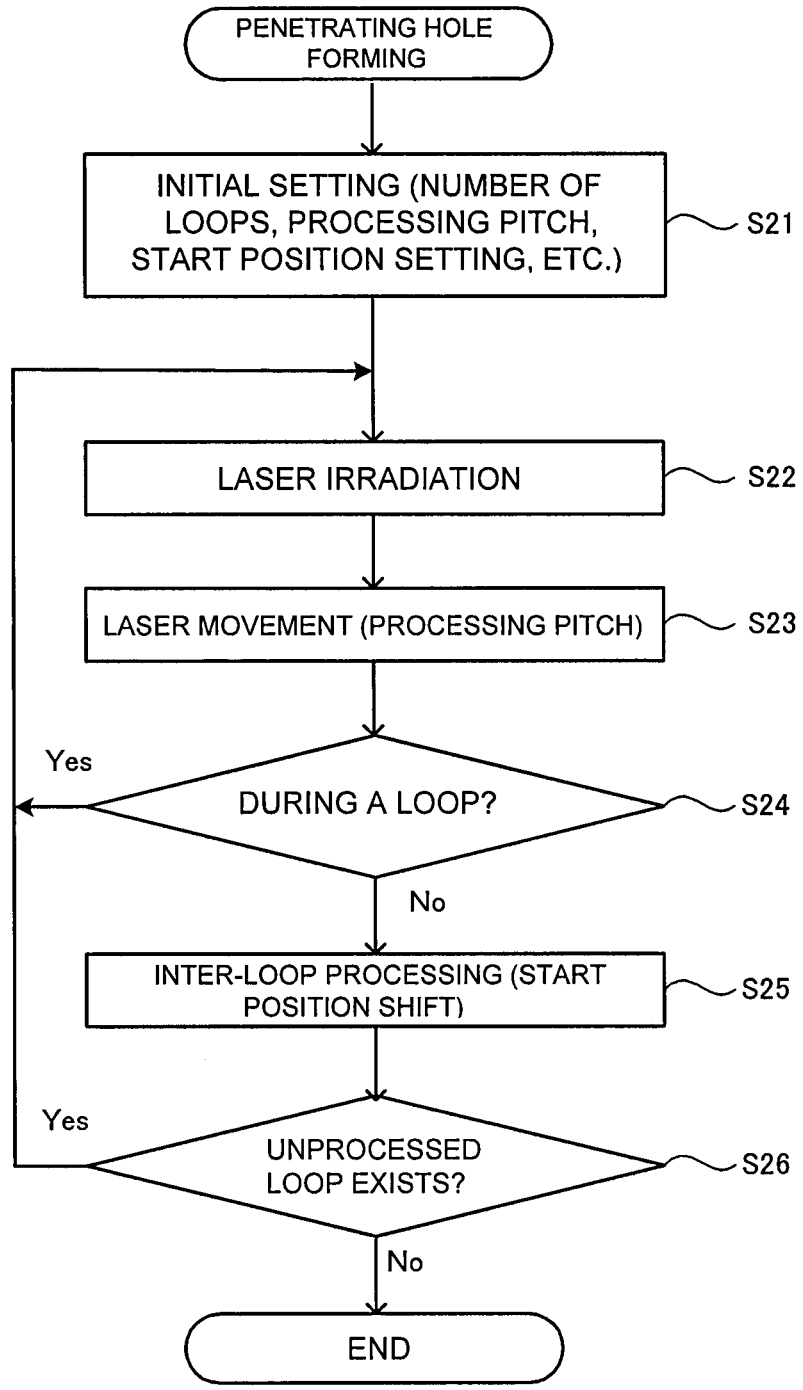
FIG. 5 is a flowchart illustrating a method for forming a penetrating hole in a core substrate.

The penetrating hole (R10) is formed in the core substrate 100 by the controller 51 performing processing from step (S21) to step (S26) shown in FIG. 5 with a computer program based on the above-described conditions.

Figure 6:
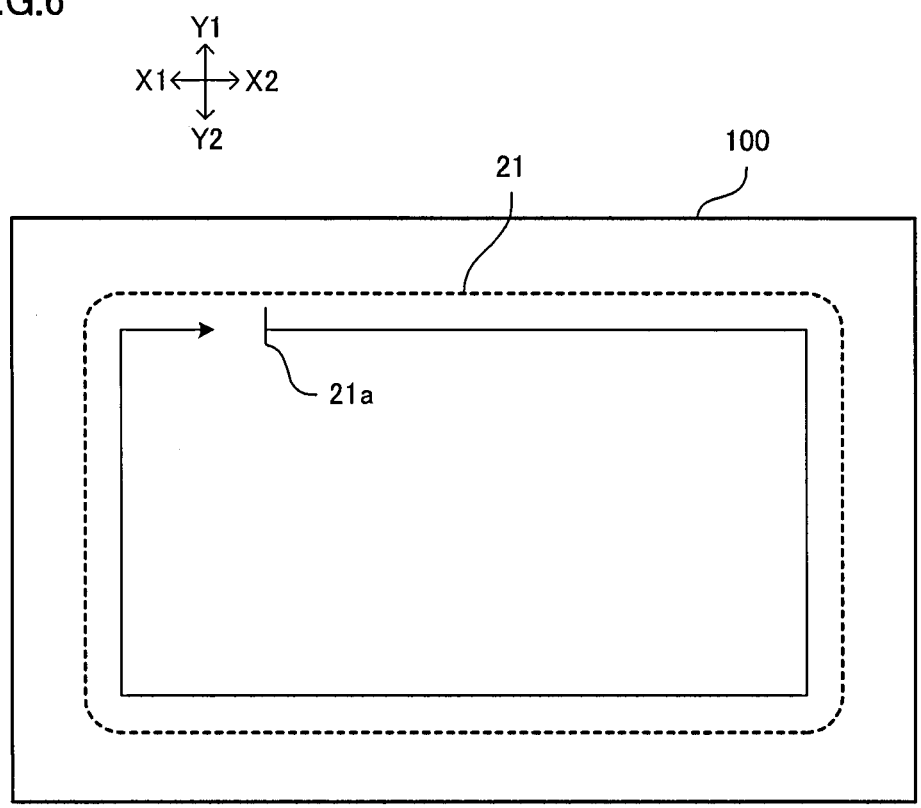
FIG. 6 is a plan view illustrating a closed loop line along which laser-processed holes are formed on the core substrate.
Figure 10:
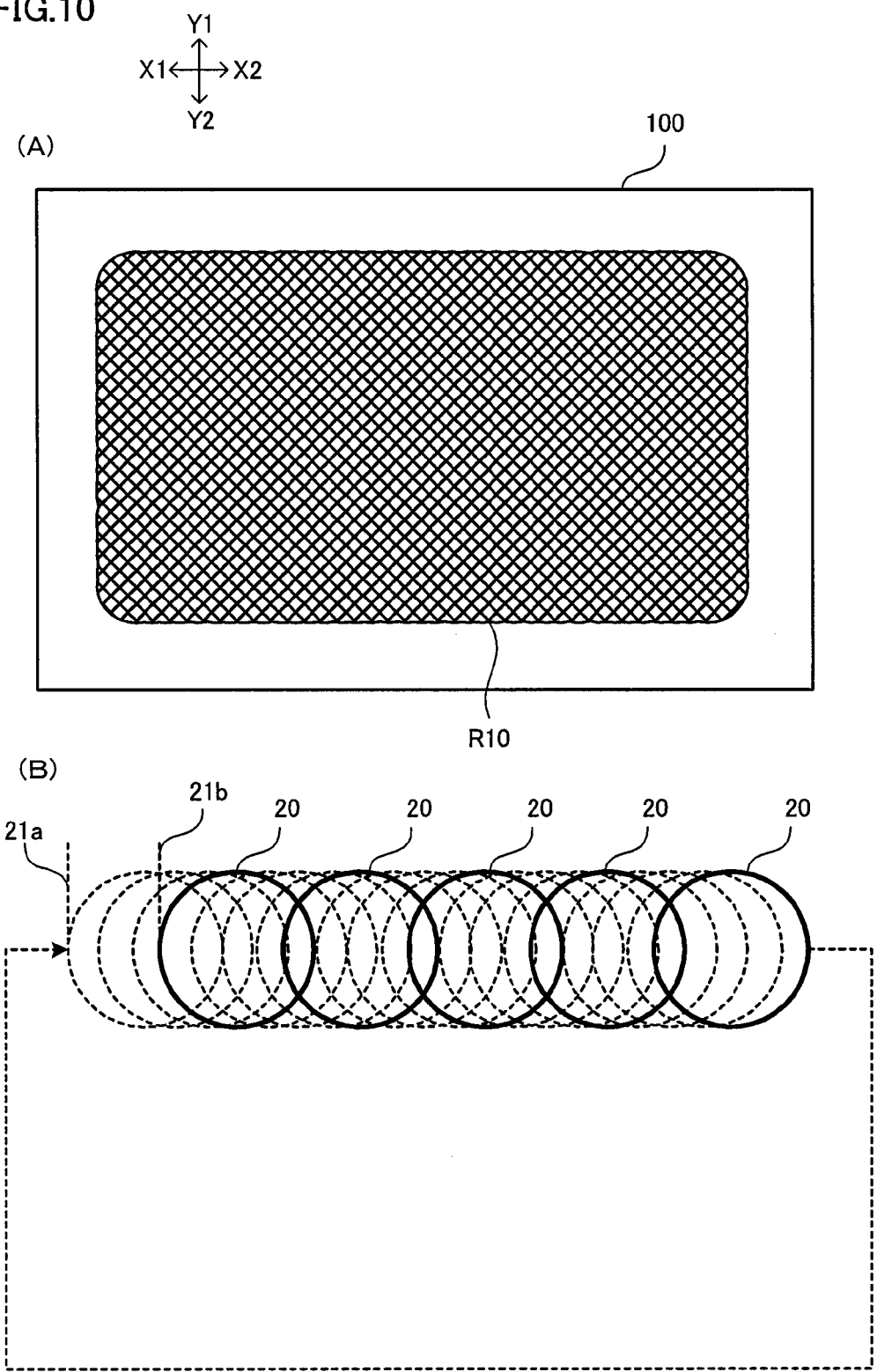
FIG. 10A is a plan view illustrating a state of processing of the core substrate with laser-processed holes when the laser irradiator has looped four times.
FIG. 10B is a diagram illustrating a string of consecutive laser-processed holes.

In step (S21), an initial setup for forming the penetrating hole (R10) is conducted. As shown in FIG. 6, the controller 51 acquires data on the shape, circumference (L) (μm), and base position (21a) of the closed loop line 21 from the memory section 52. The controller 51 sets the closed loop line 21 with the circumference of (L) (μm) on a position on the core substrate 100 where a penetrating hole is formed. The controller 51 sets the start position (21b) for the laser irradiator 34 as the base position (21a) on the closed loop line 21. In an example shown in FIG. 6, a position in the vicinity around the upper left corner of the closed loop line 21, which is substantially rectangular, is set as the base position (21a).

The controller 51 acquires data on the number of loops (n) from the memory section 52 and determines the number of loops in which the laser irradiator 34 moves along the closed loop line 21.

The controller 51 also acquires data on the shift quantity (d$_i$)(i=1 to n) from the memory section 52 and computes the offset quantity (Σd$_i$)(i=1 to n) from the base position (21a) in order to set the start position (21b) of the laser irradiator 34 when the laser irradiator 34 loops (i) times following the closed loop line 21.

Next, in step (S22), the controller 51 commands the laser generator 32 to generate the laser 11 with a time interval (Δt=1/f) derived from the set frequency (f) (Hz) so that the laser irradiator 34 radiates the laser 11 with the set output energy E (W). As a result, a laser-processed hole 20 with the diameter of (φ) (μm) is formed on the core substrate 100. The controller 51 counts cycles in which the laser irradiator 34 irradiates the laser 11 and stores the counted number in the memory section 52.

In step (S23), the controller 51 moves the laser irradiator 34 horizontally along the closed loop line 21 at the set moving velocity (v) (μm/μs). The laser-processed holes 20 are formed with the processing pitch (p) (μm) corresponding to the moving velocity (v) (μm/μs) and time interval Δt (μs) (p=v×Δt). That is, the laser irradiator 34 moves from a previous position (the start position (21b) at first) to a position (the next position) displaced forward by the processing pitch (p) (μm) per processing cycle. The controller 51 increments the number of loops every time the laser irradiator 34 loops along the closed loop line 21 and returns to the start position (21b) and stores the number of loops in the memory section 52.

In step (S24), the controller 51 repeats the processing of steps (S22) and (S23) while the laser irradiator 34 is in a looping movement along the closed loop line 21 (step (S24): Yes). When the processing performed in one loop is finished (step (S24): No), the process proceeds to the next step (S25).

In step (S25), the controller 51 performs processing desired to be done during a transition from the previous loop to the next loop. Specifically, the start position (21b), which was initially set to the base position (21a), of the laser irradiator 34 is shifted from the previous start position to the next start position by the shift quantity (d$_i$)(i=1 to n) in every loop; namely, the start position (21b) is offset from the initial start position (the base position (21a)) by the offset quantity (Σd$_i$) (i=1 to n) in every loop.

In step (S26), the controller 51 repeats the processing of steps (S22) to (S25) while the number of loops stored in the memory section 52 is less than a preset number of loops (n) (step (S26): Yes). When the number of loops reaches the preset value n (step (S26): No), the controller 51 terminates the processing to form the penetrating hole (R10).

Transition of the formed shape of the penetrating hole (R10) in each loop by the laser irradiator 34 is described below. When the laser irradiator 34 has looped once, the formed shape of the penetrating hole (R10), as shown in FIG. 7A, has an uneven wall surface since the irradiation processing is performed with intervals of the processing pitch (p)

(μm). When the laser irradiator 34 has looped twice, the formed shape of the penetrating hole (R10), has less roughness on the wall surface, as shown in FIG. 8A, i.e., smoother surface, than the through-hole R10 after the first loop. When the laser irradiator 34 has looped three times, the formed shape of the penetrating hole (R10) has further decreased roughness on the wall surface, i.e., the degree of smoothness on the surface has increased as shown in FIG. 9A. When the laser irradiator 34 has looped four times, the formed shape of the penetrating hole (R10) has a surface smooth enough for practical use as shown in FIG. 10A.

After the first loop, the laser-processed holes 20, as shown in FIG. 7B, have been formed with an interval distance of the processing pitch (p) (μm), and two adjacent laser-processed holes 20 partially overlap with each other.

After the second loop, as shown in FIG. 8B, the laser-processed holes 20 formed in the first loop, shown by dashed lines, and the laser-processed holes 20 formed in the second loop, shown by solid lines, form contiguous lines. In the second loop, the start position (21b) is displaced to a new position from the base position (21a) by the post-first-loop offset quantity $\Sigma d_1 = d_1$ (μm).

After the third loop, as shown in FIG. 9B, the laser-processed holes 20 formed in the first and second loops, shown by dashed lines, and the laser-processed holes 20 formed in the third loop, shown by solid lines, form contiguous lines. In the third loop, the start position (21b) is displaced to a new position from the base position (21a) by the post-second-loop offset quantity $\Sigma d_2 = d_1 + d_2$ (μm).

After the fourth loop, as shown in FIG. 10B, the laser-processed holes 20 formed in the first, second and third loops, shown by dashed lines, and the laser-processed holes 20 formed in the fourth loop, shown by solid lines, form contiguous lines. In the fourth loop, the start position (21b) is displaced to a new position from the base position (21a) by the post-third-loop offset quantity $\Sigma d_3 = d_1 + d_2 + d_3$ (μm).

As shown in FIG. 11A, when the diameter (φ) of the laser-processed hole 20 is 80 μm, the number of loops (n) is 4 and the shift quantities ($d_1$) to ($d_4$) of the start position (21b) associated with processing loops are 15 μm each, the processing pitch (p) becomes 60 μm and overlapping width (w) between the laser-processed holes 20 formed in the previous loop and the laser-processed holes (20a) formed in the following loop becomes 20 μM in a loop.

As shown in the above-described equation (3), even if heat has built up in the vicinity of the laser-processed holes 20 in the previous radiation of the laser 11, the heat buildup is unlikely to have adverse effects on the radiation position of the next laser-processed hole (20a) if the processing pitch (p) (μm) is set at an interval distance of at least one third the diameter (φ) (μm) of the laser-processed hole 20. That is, degradation of resin in the core substrate 100 due to excessive heat buildup in the vicinity of the laser-processed holes 20 and undesirable loss of resin from the vicinity of the laser-processed holes 20 in the desmearing treatment are prevented. With such setting, wiring patterns around the penetrating hole (R10) are also protected by decreased roughness of the surface of the penetrating hole (R10).

As shown in the above-described equation (3), it also becomes easier to maintain continuity of the laser-processed holes 20 by setting the processing pitch (p) (μm) at an interval distance less than the diameter (φ) (μm) of the laser-processed hole 20. Such setting also reduces surface roughness of the penetrating hole (R10).

If the laser-processed holes 20 overlap each other by a quarter of their diameter (φ), i.e., the processing pitch (p) (μm) is three quarters of the diameter (φ) of the laser-processed hole 20, continuity of the laser-processed holes 20 can be maintained better.

As shown in FIG. 11B, in the second loop or later, the start position (21b) is offset from the base position (21a) so that the laser 11 is irradiated between the laser-processed hole 20 formed by the irradiation in the first loop and the laser-processed hole (20a) formed by the following irradiation.

Every time the laser irradiator 34 makes a loop, the start position (21b) is shifted from the start position (21b) of the previous loop to the start position (21b) of the following loop. As described above, the shift quantity ($d_i$)(i=1 to n) by which the start position (21b) is shifted after the i-th loop is stored in the memory section 52 with respect to the number of loops (n) in advance. The controller 51 computes the offset quantity ($\Sigma d_i$)($d_1 + \ldots + d_i$) from the shift quantities ($d_i$) and, after the i-th loop, sets the start position (21b) of the next loop at a position to which the base position (21a) (the start position (21b) in the first loop) is offset by ($\Sigma d_i$)(μm). When the number of loops reaches (n), setting a new offset quantity is not necessary since the laser processing finishes at that time.

As shown in the equation (1), if the offset quantity ($\Sigma d_n$) ($d_1 + \ldots + d_n$) after the n-th loop is equal to the processing pitch (p) (μm), a position to which the start position is offset after the n-th loop is identical to the position of the laser-processed hole (20a) formed by the second irradiation in the first loop. As a result, (M) laser-processed holes 20 formed in (n) loops are arranged consecutively. This string of consecutive laser-processed holes 20 forms the penetrating hole (R10).

For example, in a case where the number of loops (n) is 4 and the shift quantity in each loop is as follows: $d_1$=15 μm; $d_2$=15 μm; $d_3$=15 μm; and $d_4$=15 μm, the offset quantities from the base position (21a) are as follows: $\Sigma d_1 = d_1$=15 μm; $\Sigma d_2 = d_1 + d_2$=30 μm; $\Sigma d_3 = d_1 + d_2 + d_3$=45 μm; and $\Sigma d_4 = d_1 + d_2 + d_3 + d_4$=60 μm.

Although the shift quantities ($d_1$) to ($d_4$) are all set at the same interval of 15 μm in the example shown in FIG. 11, the intervals need not be identical. For example, when the shift quantity in each loop is as follows: $d_1$=16 μm; $d_2$=12 μm; $d_3$=18 μm; and $d_4$=14 μm, the offset quantities from the base position (21a) are as follows: $\Sigma d_1$=16 μM; $\Sigma d_2$=28 μm; $\Sigma d_3$=46 μm; and $\Sigma d_4$=60 μm.

The shift quantities ($d_1$) to ($d_4$) may be negative values (shifting in the reverse direction) if the offset quantities are positive values (namely, if a position from which the start position (21b) is offset is located between the laser-processed hole 20 formed by the previous irradiation and the laser-processed hole (20a) formed by the following irradiation). For example, when the shift quantity in each loop is as follows: $d_1$=15 μm; $d_2$=30 μm; $d_3$=−15 μm; and $d_4$=30 the offset quantities from the base position (21a) are as follows: $\Sigma d_1$=15 μm; $\Sigma d_2$=45 μm; $\Sigma d_3$=30 μm; and $\Sigma d_4$=60 μm.

That is, the total of the shift quantities ($d_1$) to ($d_4$) coincides with the processing pitch (p) (μm). However, in each loop, the start position (21b) in the current loop is displaced from the start positions (21b) in the previous loops so as not to repeatedly irradiate a position that has been irradiated in the previous loops. As shown in the equation (4), by setting the shift quantities ($d_i$)(i=1 to n) of all loops at an identical value ($d_1 = d_2 = \ldots = d_n$), the laser-processed holes 20 are formed contiguously in a string with equal intervals and the penetrating hole (R10) with a smooth surface is achieved.

The forming efficiency of the penetrating hole (R10) in the present embodiment is described below. From the above-described equation (2b), the number of processed holes (m) of the laser-processed holes 20 formed in a loop is expressed by m=M/n where (n) is the number of loops. Processing time per hole is 1/f (sec.) since the laser 11 is irradiated with a time interval of the frequency (f) (Hz). Processing time taken in a loop is therefore expressed as m/f (sec.) from the number of processed holes (m) of the laser-processed holes 20 formed in a loop. That is, it takes m/f (sec.) to shift the start position after the previous loop and, in the next loop, irradiate the laser 11 at the position next to the laser-processed hole 20 formed in the previous loop. As shown in the equation (2a), when the processing pitch (p) (μm) is increased, the number (m) of the laser-processed holes 20 formed along a closed loop line with the circumference of (L) (μm) in a loop decreases. Then, as described above, since the irradiation cycle of the laser 11 is set to be constant depending on the frequency (f) (Hz) in the present embodiment, processing time per loop (t=m/f) is shortened. As shown in the equation (2b), in the case that (M) laser-processed holes 20 are formed in total by repeating (n) loops each of which forms (m) laser-processed holes 20, the whole processing time (T=t×n=M/f) becomes constant and manufacturing efficiency of circuit boards is thus maintained.

In order to maintain the manufacturing efficiency, it is desired to avoid adverse effects of heat. To accomplish this purpose, it is desired for the laser irradiator 34 to loop (n) times and for the processing pitch (p) (μm) of the laser irradiator 34 to be increased so that there is a time interval (t=m/f) equivalent to the duration of one loop by the time the laser 11 is irradiated at the position adjacent to the preceding laser-processed hole 20. By so setting, even if heat builds up around the laser-processed hole 20 formed in the previous loop, excessive heat buildup in adjacent positions is avoided since the buildup heat dissipates during one loop.

As described above, by arranging consecutively the laser-processed holes 20 formed in the first to the n-th loops, the roughness of the wall surface of the penetrating hole (R10) is reduced and manufacturing efficiency is maintained. With this method, it becomes easier to perform desmearing treatment, which is applied later, and the wall surface also becomes smoother by the desmearing treatment. The height of convex portions (protrusion roughness) on a rough surface of the side wall of a cavity formed eventually by this processing is 1 μm or higher and 10 μm or lower. The interval between convex portions (inter-concavity-and-convexity pitch) is 10 μm or greater and 100 μm or less.

The interior portion inside the closed loop line 21 falls off in the laser processing to form the penetrating hole (R10) while the laser irradiator 34 is looping. While the interior portion remains, the processing is performed with the interior portion attached. After the interior portion has fallen off, the processing is performed without the interior portion. As shown in the equation (3), if the processing pitch (p) (μm) is less than the diameter (φ) (μm) of the laser-processed hole 20, multiple laser-processed holes 20 become contiguous when the first loop finishes. However, it is not until the laser irradiator makes several loops that the interior portion actually falls off. As is described below, that is related to the fact that a remainder (Δe) (a portion remaining not irradiated with the laser) may occasionally be produced between the start position (21*b*) and end point (21*c*) in each loop.

Figure 12:
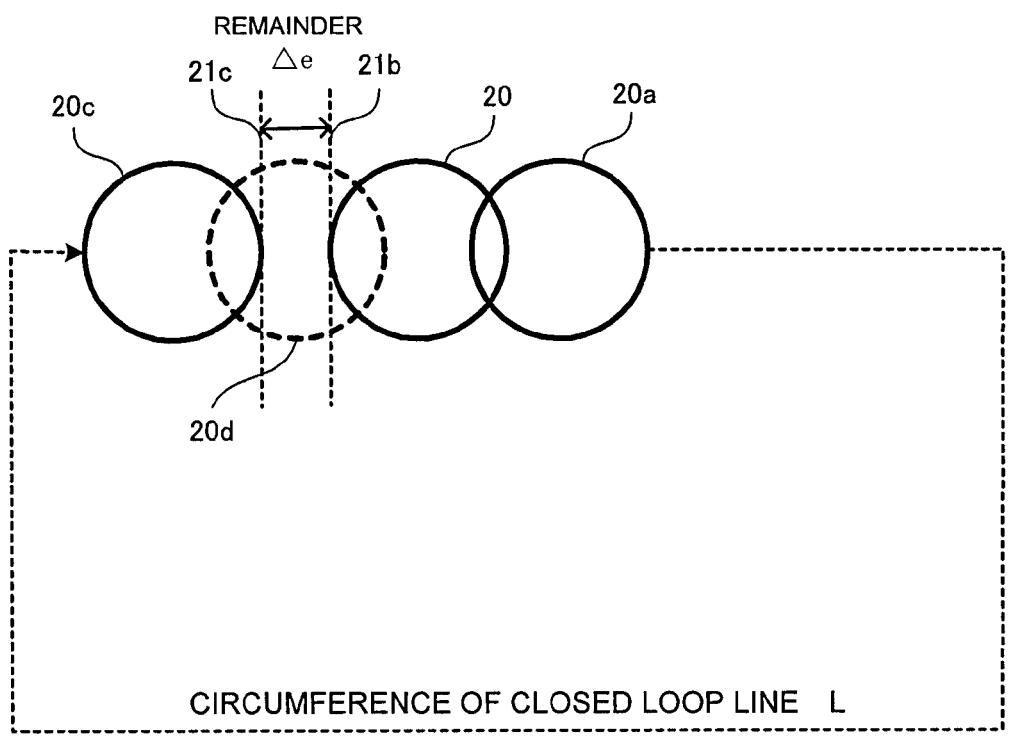
FIG. 12 is a diagram illustrating a case in which a remainder, i.e., a remaining portion not irradiated with a laser, is left between the start position and end position when the laser irradiator has finished an irradiation loop.

As shown in FIG. 12, when the laser irradiator 34 loops with the processing pitch (p) (μm), a remainder (Δe) (μm) may occasionally be produced between the start position (21*b*) and end position (21*c*) since the interval distance between the laser-processed hole 20 at the start position (21*b*) and the laser-processed hole (20*c*) at the end position (21*c*) does not always coincide with the processing pitch (p) (μm) depending on the circumference (L) (μm) of the closed loop line 21. In a case where the size of the remainder (Δe) (μm) is less than the diameter (φ) (μm) of the laser-processed hole 20, a laser-processed hole (20*d*) is added between the laser-processed hole 20 at the start position (21*b*) and the laser-processed hole (20*c*) at the end position (21*c*) in order to remove the remainder (Δe) (μm). Accordingly, the laser-processed holes 20 are made consecutively in every loop and the surface of the penetrating hole (R10) is made smooth.

Examples of forming the penetrating hole (R10) are described below using specific values with reference to FIGS. 13 and 14. In those examples, the frequency (f) set for the laser generator 32 is 2,400 Hz and the total number (M) of the laser-processed holes 20 formed on the closed loop line 21 is 212.

Figure 14:
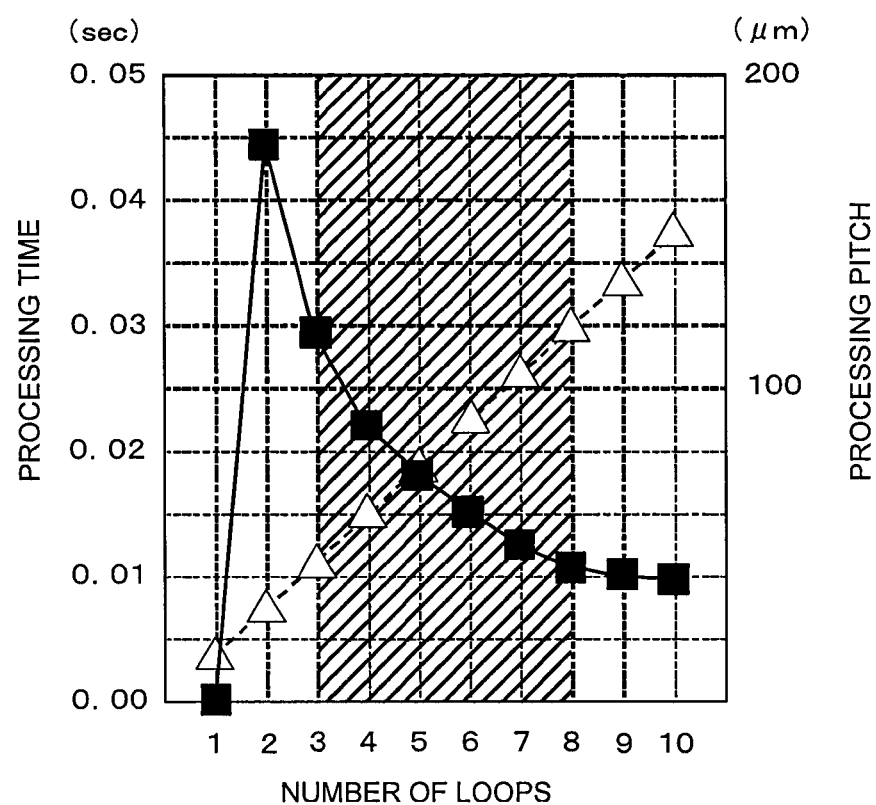
FIG. 14 is a graph illustrating the relationship between the number of irradiation loops of the laser irradiator and the duration and pitch of its processing.

As shown in FIGS. 13 and 14, in a case where the number of loops is n=1, the laser 11 is irradiated at adjacent positions successively with the processing pitch (p)=15 μm, and 212 laser-processed holes 20 are formed in a loop. In this case, the time in which to form an adjacent laser-processed hole is 1/f≅0.0004 seconds, since the adjacent laser-processed hole 20 is formed immediately. In such a case, since the laser 11 is irradiated at an adjacent position with heat accumulating around the laser-processed hole 20, excessive heat buildup is more likely to occur.

In a case where the number of loops is n=2, 106 laser-processed holes 20 are formed in a loop in which the processing pitch (p)=30 μm. The time in which to form an adjacent laser-processed hole is 106/f≅0.0442 seconds, since the laser 11 is irradiated at an adjacent position to a laser-processed hole 20 in the second loop. That is, even if heat builds up around the laser-processed hole 20 formed in the first loop, enough time will pass during a loop. However, heat could still have adverse effects since the processing pitch (p) (μm) is small and the gap between the laser-processed holes 20 in the first loop is narrow.

In a case where the number of loops (n)=3, 71 laser-processed holes 20 are formed in a loop in which the processing pitch (p)=45 μm. The time in which to form an adjacent laser-processed hole is 71/f≅L=0.0296 seconds since the laser 11 is irradiated at a position adjacent to a laser-processed hole 20 in the second loop. In this case, even if heat builds up around the laser-processed hole 20 formed in the first loop, enough time will pass during the first loop for the heat to dissipate and cease to have adverse effects. Forming a laser-processed hole 20 in the second loop at the position adjacent to the laser-processed hole 20 formed in the first loop therefore causes no problem in maintaining smoothness in the formed shapes. Since intervals between the laser-processed holes 20 are also ensured due to the processing pitch (p) (μm), heat is unlikely to have adverse effects and smoothness in the formed shapes can be maintained.

In a case where the number of loops (n)=4, 53 laser-processed holes 20 are formed in a loop in which the processing pitch (p)=60 μm. The time in which to form an adjacent laser-processed hole is 53/f≅0.0221 seconds, since the laser 11 is irradiated at a position adjacent to a laser-processed hole 20 in the second loop. In this case, even if heat builds up around the laser-processed hole 20 formed in the first loop, enough time will pass during the first loop for the heat to dissipate and cease to have adverse effects. Forming a laser-processed hole 20 in the second loop at the position adjacent to the laser-processed hole 20 formed in the first loop therefore causes no problem in maintaining smoothness in the formed shapes. Since intervals between the laser-processed holes 20 are also ensured due to the processing pitch (p) (μm), heat is unlikely to have adverse effects in the intervals, and smoothness in the formed shapes can be maintained. The processing pitch (p) (μm) and duration of a loop are well balanced, and the formed shape thus becomes smoother than in the case where the number of loops (n) is 3. When the diameter (φ) of the laser-processed hole 20 is 80 μm, the processing pitch (p) (μm) is three quarters of the diameter (φ) and the laser-processed holes 20 have better consecutiveness.

In a case where the number of loops (n)=5, 43 laser-processed holes 20 are formed in a loop in which the processing pitch (p)=75 μm. The time in which to form an adjacent laser-processed hole is 43/f≅0.0179 seconds, since the laser 11 is irradiated at a position adjacent to a laser-processed hole 20 in the second loop. In this case, even if heat builds up around the laser-processed hole 20 formed in the first loop, enough time will pass during the first loop for the heat to dissipate and cease to have adverse effects. Forming a laser-processed hole 20 in the second loop at the position adjacent to the laser-processed hole 20 formed in the first loop therefore causes no problem in maintaining smoothness in the formed shapes. Since intervals between the laser-processed holes 20 are also ensured due to the processing pitch (p) (μm), heat is unlikely to have adverse effects, and smoothness in the formed shapes is maintained, although at a level slightly less smooth compared with cases in which the number of loops (n) is 4.

In a case where the number of loops (n)=6, 36 laser-processed holes 20 are formed in a loop in which the processing pitch (p)=90 μm. The time in which to form an adjacent laser-processed hole is 36/f≅0.015 seconds since the laser 11 is radiated at a position adjacent to a laser-processed hole 20 in the second loop. In this case, even if heat builds up around the laser-processed hole 20 formed in the first loop, enough time will pass during the first loop for the heat to dissipate and cease to have adverse effects. Forming a laser-processed hole 20 in the second loop at the position adjacent to the laser-processed hole 20 formed in the first loop therefore causes no problem in maintaining smoothness in the formed shapes. Since intervals between the laser-processed holes 20 are also ensured due to the processing pitch (p) (μm), heat is unlikely to have adverse effects in the intervals, and smoothness in the formed shapes is maintained, although at a level slightly less smooth compared with cases in which the number of loops (n) is 4.

In a case where the number of loops (n)=7, 31 laser-processed holes 20 are formed in a loop in which the processing pitch (p)=105 μm. The time in which to form an adjacent laser-processed hole is 31/f≅0.0126 seconds, since the laser 11 is irradiated at a position adjacent to a laser-processed hole 20 in the second loop. In this case, even if heat builds up around the laser-processed hole 20 formed in the first loop, enough time will pass during the first loop for the heat to dissipate and cease to have adverse effects. Forming a laser-processed hole 20 in the second loop at the position adjacent to the laser-processed hole 20 formed in the first loop therefore causes no problem in maintaining smoothness in the formed shapes. Since intervals between the laser-processed holes 20 are also ensured due to the processing pitch (p) (μm), heat is unlikely to have adverse effects in the intervals. However, since the processing pitch (p) (μm), 105 μm, is too long, the consecutiveness of holes is unlikely to be maintained. In a case where the consecutiveness is maintained, the formed shape becomes smooth.

In a case where the number of loops (n)=8, 27 laser-processed holes 20 are formed in a loop in which the processing pitch (p)=120 μm. The time in which to form an adjacent laser-processed hole is 27/f≅0.0113 seconds, since the laser 11 is irradiated at a position adjacent to a laser-processed hole 20 in the second loop. In this case, even if heat builds up around the laser-processed hole 20 formed in the first loop, enough time will pass during the first loop for the heat to dissipate and cease to have adverse effects. Forming a laser-processed hole 20 in the second loop at the position adjacent to the laser-processed hole 20 formed in the first loop therefore causes no problem in maintaining smoothness in the formed shapes. Since intervals between the laser-processed holes 20 are also ensured due to the processing pitch (p) (μm), heat is unlikely to have adverse effects in the intervals. However, since the processing pitch (p) (μm) set at 120 μm is too long, the consecutiveness of holes is unlikely to be maintained. In a case where the consecutiveness is maintained, the formed shape becomes smooth.

In a case where the number of loops (n)=9, 24 laser-processed holes 20 are formed in a loop in which the processing pitch (p)=135 μm. The time in which to form an adjacent laser-processed hole is 24/f≅0.0100 seconds, since the laser 11 is radiated at a position adjacent to a laser-processed hole 20 in the second loop. When the number of loops (n) takes a large value as in this case, since the number of the laser-processed holes 20 formed in a loop (m) decreases, the processing time taken in a loop becomes shorter. In this case, although the intervals between the laser-processed holes 20 are ensured due to the processing pitch (p) (μm), it is likely that heat still builds up around the laser-processed holes 20 formed in the first loop since it takes a shorter time for a loop.

If the processing pitch (p) (μm) takes a large value and an interval between the laser-processed holes 20 in a loop is too wide, positional gaps may occur when the laser-processed holes 20 are formed consecutively and the surface roughness of the penetrating hole (R10) is likely to increase. Therefore, in order for the laser-processed holes 20 to overlap each other, the processing pitch (p) (μm) is determined in a range of values so as to meet the above-described equation (3) based on the diameter (φ) (μm) of the laser-processed hole 20; the shift quantities ($d_1$) to ($d_n$) for every loop are determined based on the number of loops (n) so as to meet the above-described equations (1) and (4) using the determined processing pitch (p) (μm); and the laser processing is performed so as to meet the equations (2a) and (2b).

As shown in FIG. 14, the number of loops (n) is preferred to be 3 or greater and 8 or less. If the number of loops (n) is greater than 8, since the duration of a loop is too short, the laser 11 is irradiated when heat is still built up around the laser-processed holes 20. This may lead to degradation in the formed shape of the surface of the penetrating hole (R10) due to adverse effects of the heat. If the number of loops (n) is less than 3, since the interval distance between the laser-processed holes 20 in a loop is too small, the formed shape of the surface of the penetrating hole (R10) may degrade. In order to maintain consecutiveness without increasing the processing pitch (p) (m), the number of loops (n) is preferred to be 3 or greater and 6 or less.

By so setting as above, a cavity with a preferred shape for a circuit board is formed without decreasing productivity in circuit board manufacturing.

Modified Example 1

Although the penetrating hole (R10) is formed on the one-layer core substrate 100 in the embodiment above, the penetrating hole (R10) may be formed, as shown in FIG. 15C, on the core substrate 100, which is structured with multiple insulation layers (100b, 100c) laminated on both surfaces of a flat board (100a) as shown in FIG. 15B, if the flat board (100a) to be used as the core substrate 100 is thin as shown in FIG. 15A.

When a cavity to accommodate the electronic component 200 is formed in a core substrate 100 that is thinner than the height of electronic component 200, the penetrating hole (R10) is formed in a core substrate 100 made to have the same thickness as the height of the electronic component 200 by laminating insulation layers (100b, 100c) on a flat board (100a). The insulation layers (100b, 100c) may contain reinforced fibers to strengthen the core substrate.

As shown in FIG. 15D, by accommodating the electronic component 200 in the penetrating hole (R10) formed in the laminated core substrate 100, and by laminating insulation layers (101, 102) on both surfaces of the core substrate 100, the penetrating hole (R10) becomes the cavity to accommodate the electronic component 200.

In the case of a laminated core substrate 100, the layers tend to fuse due to the thinness of each layer and roughness may thus develop between the layers. However, by forming the penetrating hole (R10) with the cavity-forming method according to the present embodiment, heat buildup is unlikely to produce adverse effects in the vicinity of the position at which the penetrating hole (R10) is formed with the laser 11 irradiated onto the core substrate 100. Roughness is therefore suppressed between the layers, and the formed shape of the surface of the penetrating hole (R10) is made smooth. The electronic component 200 is accommodated in the penetrating hole (R10) formed as above.

Modified Example 2

Figure 16:
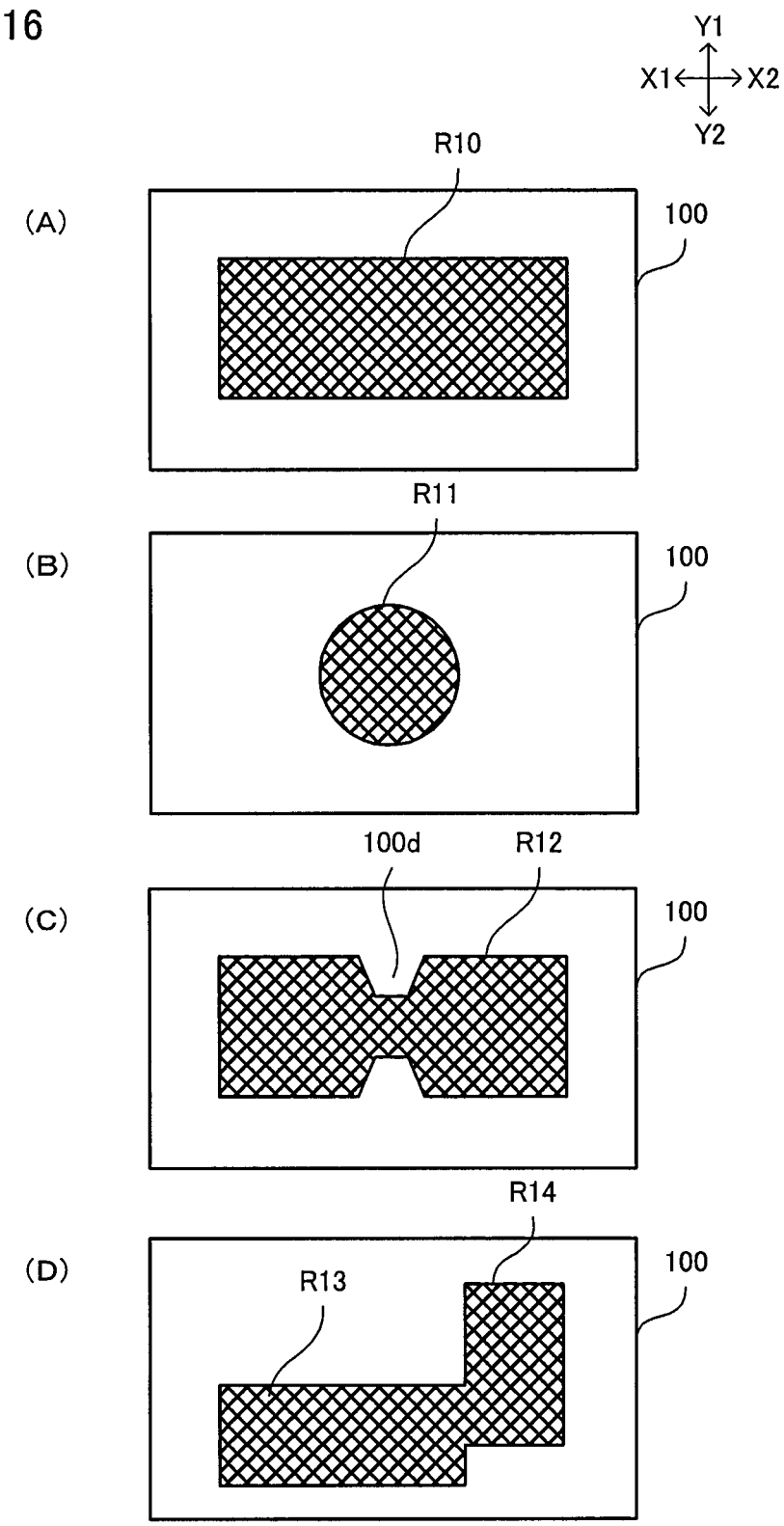
FIGS. 16A to 16D are plan views illustrating examples of cavity shapes formed by a cavity-forming method according to modified examples of the present invention.

In the embodiment above, a cavity is formed by forming the penetrating hole (R10) in a rectangular or substantially rectangular shape with round corners on the core substrate 100 as shown in FIG. 16A. However, the shape of the cavity may be changed accordingly depending on the size of electronic component 200.

For example, as shown in FIG. 16B, the cavity may be formed with a circular or elliptical penetrating hole (R11).

Alternatively, as shown in FIG. 16C, the cavity may be formed by forming the penetrating hole (R12) in a rectangular shape separated by two protrusions (100d), which protrude so as to face each other. The protrusions (100d) are portions that protrude toward the inside of the cavity and partition the cavity into multiple spaces. By so structuring, the electronic components 200 are accommodated in each of the multiple spaces to prevent contact between the electronic components 200.

As shown in FIG. 16D, the cavity may also be formed by combining two or more penetrating holes (R13, R14). By connecting a horizontally long rectangular penetrating hole (R13) with a vertically long rectangular penetrating hole (R14), for example, the space in the cavity is enlarged. The electronic components 200 are accommodated in such space.

Modified Example 3

In the embodiment above, the laser irradiator 34 is moved along the closed loop line 21 set on the core substrate 100 as shown in FIG. 17A. However, the processing route along which the laser irradiator 34 moves may have a slight margin of error or irregularity in values or a range to be set.

For example, as shown in FIG. 17B, the laser irradiator may move along a processing route 22 in a half loop from the start position (21b) at the upper-left corner, then return to the start position (21b), and move along a processing route (22a) in the other half loop. Alternatively, as shown in FIG. 17C, the laser irradiator may move rightward along a processing route (22b) from a start position (21b) at the upper-left corner, move rightward along a processing route (22c) from a start position (21d) at the lower-left corner, move downward along a processing route (22d) from the start position (21b), and move downward along a processing route (22e) from a start position (21e) at the upper-right corner. The processing routes (22, 22a) and the processing routes (22b to 22e) are paths along the closed loop line 21.

Since the laser irradiator 34 can cover all tracks on the closed loop line 21, moving the laser irradiator 34 along the closed loop line 21 by the movement patterns described above is included in the definition of "to loop" in the embodiment above and its modified examples. That is, it is also possible to form the penetrating hole (R10) by forming multiple laser-processed holes 20 consecutively along the closed loop line 21 described above.

The functions of the laser processing apparatus 10 according to the embodiment above can be realized with not only dedicated hardware but also a general-purpose computer system.

For example, an apparatus that executes the above-described processing can be configured by storing programs in the memory section 52 in a computer-readable storage medium, such as a flexible disk, CD-ROM (Compact Disk Read-Only Memory), DVD (Digital Versatile Disk), and MO (Magneto-Optical disk) distributing the medium, and installing the programs in a computer.

The same configuration as described above can also be realized by storing programs in a disk storage device contained in a server apparatus on the network such as the Internet, superposing the program on a carrier wave, and downloading the program to a computer.

The above-described processing can be achieved by transferring the programs via the communication network and launching the programs simultaneously.

The above-described processing can also be achieved by running the whole or a part of the program on a server and making a client computer complete the execution of the program by transmitting and receiving information through a communication network.

In a case where the above-described functions are achieved by sharing them with the OS (Operating System) or through cooperation between the OS and an application, only a portion of the program other than the portion executed by the OS may be distributed by storing it in a medium or downloaded to a computer.

A means to achieve the functions of the controller 51 is not limited to software; all or some may be achieved with dedicated hardware, for example, a circuit.

When a penetrating hole is formed by irradiating a laser, the formed shape of the penetrating hole may occasionally become rough due to adverse effects of heat buildup in the vicinity of a laser-processed hole as the laser is irradiated. If the distance between laser-processed holes is set greater so as to avoid the adverse effects of heat, the shape of the penetrating hole becomes irregular and may result in roughness of the surface of the cavity wall. If the laser irradiation intervals are set longer, productivity of manufacturing circuit boards decreases.

According to an embodiment of the present invention, a cavity with a smooth surface shape is formed in a circuit board without lowering productivity in manufacturing circuit boards.

A cavity-forming method according to an embodiment of the present invention includes forming a laser-processed hole with a diameter of ($\phi$) ($\mu$m) by consecutively irradiating laser from a laser irradiator onto a flat board as a core substrate, and from a position set as a start position on a closed loop line having a circumference of (L) ($\mu$m) on the core substrate, moving the laser irradiator in a loop along the closed loop line. In such a cavity-forming method, while the start position of a first loop by the laser irradiator is set as a base position on the closed loop line and the following equations (1), (2a) and (2b) are satisfied, the laser irradiator loops (n) (n: a natural number of 2 or greater) times along the closed loop line with a processing pitch of (p) (μm) to form (m) (m: a natural number) laser-processed holes in each loop by irradiating laser from the laser irradiator, as a start position after the i-th (i=1, 2, ..., n−1) loop made by the laser irradiator is offset from the base position by $\Sigma d_i$ (μm) (i=1, 2, ..., n−1), so that (M) (M: a natural number) laser-processed holes are made contiguous along the closed loop line in (n) loops to obtain a hole that penetrates through the core substrate.

$$p = \Sigma d_i (i=1 \text{ to } n) \tag{1}$$

$$m \cong L/p \tag{2a}$$

$$M = m \times n \tag{2b}$$

In a cavity-forming method according to an embodiment of the present invention, the following equation (3) is preferred to be satisfied.

$$\phi/3 \leq p < \phi \tag{3}$$

In cavity-forming method according to an embodiment of the present invention, the following equation (4) is preferred to be satisfied.

$$d_1 = d_2 = \ldots = d_n \tag{4}$$

In a cavity-forming method according to an embodiment of the present invention, the natural number is preferred to be (n) of 3 or greater and 8 or less.

In a cavity-forming method according to an embodiment of the present invention, a laser is preferred to have a frequency of (f) Hz, where (f) is 1200 Hz or higher and 10000 Hz or lower.

In a cavity-forming method according to an embodiment of the present invention, a laser is preferred to have an output energy of 1 W or greater and 50 W or less.

In a cavity-forming method according to an embodiment of the present invention, the thermal conductivity of the core substrate it preferred to be 0.60 W/(m·K) or higher and 1 W/(m·K) or lower.

In a cavity-forming method according to an embodiment of the present invention, desmearing is preferred to be conducted on the penetrating hole.

In a cavity-forming method according to an embodiment of the present invention, the penetrating hole is preferred to be shaped in a rectangle, a circle, a rectangular hole separated by two protrusions facing each other, or a combination thereof.

A cavity-forming apparatus according to an embodiment of the present invention includes an irradiation unit that forms a laser-processed hole with a diameter of (φ) (μm) by consecutively irradiating laser from a laser irradiator onto a flat board as a core substrate, a movement unit that moves the laser irradiator in a loop along a closed loop line having a circumference of (L) (μm) on the core substrate, setting a position on the closed loop line as a start position, and while the start position of the first loop is set as a base position on the closed loop line and the following equations (1), (2a) and (2b) are satisfied, a controller that moves the laser irradiator in a loop along the closed loop line (n) times (n: a natural number of 2 or greater) with a processing pitch of (p) (μm) to form (m) laser-processed holes (m: a natural number) in each loop by irradiating laser from the laser irradiator, as a start position after the i-th (i=1, 2, ..., n−1) loop made by the laser irradiator is offset from the base position by $(\Sigma d_i)$(μm) (i=1, 2, ..., n−1), so that (M) (M: a natural number) laser-processed holes are made contiguous along the closed loop line in (n) loops to obtain a hole that penetrates through the core substrate.

$$p = \Sigma d_i (i=1 \text{ to } n) \tag{1}$$

$$m \cong L/p \tag{2a}$$

$$M = m \times n \tag{2b}$$

A program according to an embodiment of the present invention instructs a computer to take the following steps: forming a laser-processed hole with a diameter of (φ) (μm) by consecutively irradiating laser from a laser irradiator onto a flat board as a core substrate; by setting a position as a start position on a closed loop line on the core substrate, moving the laser irradiator in a loop along the closed loop line from the start position; and while the start position of a first loop by the laser irradiator is set as a base position on the closed loop line and the following equations (1), (2a) and (2b) are satisfied, moving the laser irradiator in a loop (n) times (n: a natural number of 2 or greater) along the closed loop line with a processing pitch of (p) (μm) to form (m) laser-processed holes (m: a natural number) in each loop with the laser irradiator by irradiating a laser, as a start position after the i-th (i=1, 2, ..., n−1) loop made by the laser irradiator is offset from the base position by $(\Sigma d_i)$(μm) (i=1, 2, ..., n−1), so that (M) (M: a natural number) laser-processed holes are made contiguous along the closed loop line in (n) loops to obtain a hole that penetrates through the core substrate.

$$p = \Sigma d_i (i=1 \text{ to } n) \tag{1}$$

$$m \cong L/p \tag{2a}$$

$$M = m \times n \tag{2b}$$

A manufacturing method of a circuit board according to an embodiment of the present invention includes preparing a core substrate in which a penetrating hole is formed with the cavity-forming method, and laminating a first interlayer insulation layer and a second interlayer insulation layer on a first surface and a second surface of the core substrate respectively. In such a method, a cavity to accommodate an electronic component is formed with the penetrating hole, the first interlayer insulation layer and the second interlayer insulation layer.

In a manufacturing method of a circuit board according to an embodiment of the present invention, when preparing the core substrate to have a penetrating hole, it is preferred to form the penetrating hole in a core substrate where multiple insulation layers are laminated on a flat board.

A circuit board according to an embodiment of the present invention includes a core substrate in which a penetrating hole is formed with the cavity-forming method, and a first interlayer insulation layer and a second interlayer insulation layer laminated on a first surface and a second surface of the core substrate respectively. In such a circuit board, a cavity to accommodate an electronic component is formed with the penetrating hole, the first interlayer insulation layer and the second interlayer insulation layer.

In a circuit board according to an embodiment of the present invention, it is preferred to form the penetrating hole in a core substrate fabricated by laminating multiple insulation layers on a flat board.

In a circuit board according to an embodiment of the present invention, a convex portion of the roughened surface on a side wall of the cavity is preferred to have a height of 1 μm or higher and 10 μm or lower.

In a circuit board according to an embodiment of the present invention, convex portions of the roughened surface on a side wall of the cavity are preferred to have an interval of 10 μm or greater and 100 μm or less.

According to an embodiment of the present invention, a cavity with a preferred shape is formed in a circuit board without decreasing productivity in manufacturing circuit boards.

Obviously, numerous modifications and variations of the present invention are possible in light of the above teachings. It is therefore to be understood that within the scope of the appended claims, the invention may be practiced otherwise than as specifically described herein.

What is claimed is:

1. A method for forming a cavity in a core substrate, comprising:
    setting a start position on a closed loop line having a circumference L in μm for a core substrate;
    consecutively irradiating laser from a laser irradiating device upon a flat board for the core substrate such that a plurality of laser-processed holes each having a diameter φ in μm is formed in the flat board; and
    moving the laser irradiating device in a loop from the start position of the closed loop line along the closed loop line such that a penetrating hole penetrating through the flat board is formed in the flat board for the core substrate,
    wherein the start position of a first loop by the laser irradiating device is set as a base position on the closed loop line, the moving of the laser irradiating device includes shifting the start position by a distance d after each loop and controlling the laser irradiating device such that the moving of the laser irradiating device in the loop satisfies p=Σd$_i$, m≅L/p and M=m×n, where i=1 to n, n represents a number of loops by the laser irradiating device and is a natural number of 2 or greater, p represents a processing pitch of the laser-processed holes, m represents a number of the laser-processed holes in each loop and is a natural number, Σd$_i$ is a total distance shifted from the base position for the start position of the laser irradiating device after an i-th loop, and M is a number of the laser-processed holes formed by the number of loops along the closed loop line and is a natural number.

2. The method for forming a cavity according to claim 1, wherein the processing pitch and the diameter φ of each of the laser-processed holes satisfy φ/3≤p<φ.

3. The method for forming a cavity according to claim 1, wherein the distance d is an equal distance for each of the loops.

4. The method for forming a cavity according to claim 1, wherein n is in a range of 3 to 8.

5. The method for forming a cavity according to claim 1, wherein the laser irradiating device irradiates laser having a frequency in a range of 1,200 Hz to 10,000 Hz.

6. The method for forming a cavity according to claim 1, wherein the laser irradiating device irradiates laser having an output energy in a range of 1 W to 50 W.

7. The method for forming a cavity according to claim 1, wherein the flat board has a thermal conductivity in a range of 0.60 W/(m·K) to 1 W/(m·K).

8. The method for forming a cavity according to claim 1, further comprising applying a desmearing treatment on the penetrating hole penetrating through the flat board.

9. The method for forming a cavity according to claim 1, wherein the moving of the laser irradiating device includes moving of the laser irradiating device along the closed loop such that the penetrating hole has a rectangle shape, a circle shape, a rectangular shape partitioned by two protrusions facing each other or a shape having a combination thereof.

10. An apparatus for forming a cavity in a core substrate, comprising:
    a laser irradiating device configured to consecutively irradiate laser upon a flat board such that a plurality of laser-processed holes each having a diameter φ in μm is formed in the flat board;
    a moving device configured to move the laser irradiating device in a loop along a closed loop line from a start position of the closed loop line such that a penetrating hole penetrating through the flat board is formed in the flat board for the core substrate; and
    a control device configured to set the start position of the closed loop line having a circumference L in μm for the core substrate, set the start position of a first loop by the laser irradiating device as a base position on the closed loop line, shift the start position by a distance d after each loop and control the laser irradiating device such that movement of the laser irradiating device in the loop satisfies p=Σd$_i$, m≅L/p and M=m×n, where i=1 to n, n represents a number of loops by the laser irradiating device and is a natural number of 2 or greater, p represents a processing pitch of the laser-processed holes, m represents a number of the laser-processed holes in each loop and is a natural number, Σd$_i$ is a total distance shifted from the base position for the start position of the laser irradiating device after an i-th loop, and M is a number of the laser-processed holes formed by the number of loops along the closed loop line and is a natural number.

11. A non-transitory computer-readable medium including a program, which when executed by an information processing apparatus in the apparatus according to claim 10, causes the information processing apparatus to:
    instruct the laser irradiating device to consecutively irradiate laser upon a flat board such that a plurality of laser-processed holes each having a diameter φ in μm is formed in the flat board;
    instruct the moving device to move the laser irradiating device in a loop along a closed loop line from a start position of the closed loop line such that a penetrating hole penetrating through the flat board is formed in the flat board for the core substrate; and
    instruct the control device to set the start position of the closed loop line having a circumference L in μm for the core substrate, set the start position of a first loop by the laser irradiating device as a base position on the closed loop line, shift the start position by a distance d after each loop and control the laser irradiating device such that movement of the laser irradiating device in the loop satisfies p=Σd$_i$, m≅L/p and M=m×n, where i=1 to n, n represents a number of loops by the laser irradiating device and is a natural number of 2 or greater, p represents a processing pitch of the laser-processed holes, m represents a number of the laser-processed holes in each loop and is a natural number, Σd$_i$ is a total distance shifted from the base position for the start position of the laser irradiating device after an i-th loop, and M is a number of the laser-processed holes formed by the number of loops along the closed loop line and is a natural number.

12. A method for manufacturing a printed circuit board, comprising:
    preparing a core substrate comprising a plurality of insulation layers;

setting a start position on a closed loop line having a circumference L in μm for the core substrate;

consecutively irradiating laser from a laser irradiating device upon the core substrate such that a plurality of laser-processed holes each having a diameter ϕ in μm is formed in the core substrate; and moving the laser irradiating device in a loop from the start position of the closed loop line along the closed loop line such that a penetrating hole configured to accommodate an electronic component and penetrating through the core substrate is formed in the core substrate;

wherein the start position of a first loop by the laser irradiating device is set as a base position on the closed loop line, the moving of the laser irradiating device includes shifting the start position by a distance d after each loop and controlling the laser irradiating device such that the moving of the laser irradiating device in the loop satisfies $p=\Sigma d_i$, $m \cong L/p$ and $M=m \times n$, where i=1 to n, n represents a number of loops by the laser irradiating device and is a natural number of 2 or greater, p represents a processing pitch of the laser-processed holes, m represents a number of the laser-processed holes in each loop and is a natural number, $\Sigma d_i$ is a total distance shifted from the base position for the start position of the laser irradiating device after an i-th loop, and M is a number of the laser-processed holes formed by the number of loops along the closed loop line and is a natural number.

13. The method for manufacturing a printed circuit board according to claim 12, further comprising:

accommodating the electronic component in the through hole formed in the core substrate;

forming a first interlayer insulation layer on a first surface side of the core substrate; and forming a second interlayer insulation layer on a second surface side of the core substrate on an opposite side of the first surface side such that the core substrate, the first interlayer insulation layer and the second interlayer insulation layer form a cavity in which the electronic component is positioned.

14. The method manufacturing a printed circuit board according to claim 12, wherein the processing pitch and the diameter ϕ of each of the laser-processed holes satisfy $\phi/3 \le p < \phi$.

15. The method for manufacturing a printed circuit board according to claim 12, wherein the distance d is an equal distance for each of the loops.

16. The method for manufacturing a printed circuit board according to claim 12, wherein n is in a range of 3 to 8.

17. A printed circuit board, produced by the method for manufacturing a printed circuit board according to claim 12, wherein the penetrating hole has a side wall having convex portions such that the convex portions of the side wall have a height in a range of 1 μm to 10 μm.

18. A printed circuit board, produced by the method for manufacturing a printed circuit board according to claim 13, wherein the cavity has a side wall having convex portions such that the convex portions of the side wall have a height in a range of 1 μm to 10 μm.

19. A printed circuit board, produced by the method for manufacturing a printed circuit board according to claim 12, wherein the penetrating hole has a side wall having convex portions such that the convex portions of the side wall have a height in a range of 10 μm to 100 μm.

20. A printed circuit board, produced by the method for manufacturing a printed circuit board according to claim 13, wherein the cavity has a side wall having convex portions such that the convex portions of the side wall have a height in a range of 10 μm to 100 μm.

* * * * *